(12) United States Patent
Hopkins et al.

(10) Patent No.: US 7,545,158 B2
(45) Date of Patent: Jun. 9, 2009

(54) METHOD FOR TESTING SYSTEM-IN-PACKAGE DEVICES

(75) Inventors: James E. Hopkins, Mesa, AZ (US); Michael Peter Costello, Queen Creek, AZ (US); Herbert Tsai, Kaohsiung (TW); Ching-Too Chen, Chandler, AZ (US)

(73) Assignee: Chroma ATE Inc., Taoyuan Hsien (TW)

(*) Notice: Subject to any disclaimer, the term of this patent is extended or adjusted under 35 U.S.C. 154(b) by 0 days.

(21) Appl. No.: 11/786,766

(22) Filed: Apr. 12, 2007

(65) Prior Publication Data

US 2008/0252313 A1 Oct. 16, 2008

(51) Int. Cl.
*G01R 31/02* (2006.01)

(52) U.S. Cl. .................................... 324/754
(58) Field of Classification Search ............. 324/754
See application file for complete search history.

(56) References Cited

U.S. PATENT DOCUMENTS

| | | | |
|---|---|---|---|
| 6,515,470 B2 * | 2/2003 | Suzuki et al. | 324/158.1 |
| 6,522,777 B1 * | 2/2003 | Paulsen et al. | 382/154 |
| 7,095,242 B2 * | 8/2006 | Bjork | 324/765 |

* cited by examiner

*Primary Examiner*—Ha Tran T Nguyen
*Assistant Examiner*—Shaun Campbell
(74) *Attorney, Agent, or Firm*—Donald J. Lenkszus

(57) ABSTRACT

A method for testing System-In-Package (SIP) devices each having a plurality of electrical contacts is described. The method and apparatus utilizes industry standard JEDEC trays and tests at least a predetermined portion of all devices in such trays at the same time.

20 Claims, 24 Drawing Sheets

METHOD FOR TESTING SYSTEM-IN-PACKAGE DEVICES

FIELD OF THE INVENTION

The invention relates to the testing of electronic devices, in general, and to electrical testing of system-in-package devices disposed in industry standard processing trays, in particular.

BACKGROUND OF THE INVENTION

As the complexity of semiconductor devices increases, more and more the use of "system-in-package" (SIP) device assemblies are being utilized. With increasing complexity of systems, SIPs are becoming more desirable than "system-on-chip" (SOC) because the cost with respect to function and time to market increase dramatically with complexity of the system. The growth in use of SIP devices is being driven by the price sensitive wireless, consumer and automotive markets.

Examples of devices being implemented as SIP devices include: cellular devices, PDAs, handheld devices, Bluetooth™ solutions, flash memory, image sensors, power amplifiers, GPS modules, and mini-SD (secure digital) devices.

A SIP device in one formulation may be a module that is a fully functional subsystem package comprising a substrate, one or more die, chip-level interconnects, integrated or surface-mounted passive and active components, and a protective casing.

A SIP device in another formulation may be a stacked-die assembly that utilizes a standard package incorporating two or more vertically stacked die, and chip-level interconnects on a substrate.

A SIP device in a further formulation may be a multi-chip module that utilizes a standard package incorporating two or more horizontally arranged die and chip-level interconnects on a substrate.

A SIP device in yet a further formulation may be a combination of standard prepackaged devices stacked vertically with package-level interconnects.

The use of SIP devices raises significant changes from a testing viewpoint. SIP devices place emphasis on the use of "known good die" before packaging. The product lifetime for SIP devices will become shorter. SIP devices provide much less access to testing points. High throughput testing is required for cost minimization. The demand is for low cost testing.

The use of "known good die" will most likely lead to the conclusion that there is little need to retest dies.

Less access to test points means that traditional final tests on SIP devices will not be possible.

The increasing use of SIP devices in consumer electronics leads to the conclusion that low testing cost is crucial.

For all these reasons, traditional automatic test equipment testing models are not the best approach for testing SIP devices.

Current automatic test equipment solutions that are low in cost have low test throughput. In addition, most of the automatic test equipment approaches utilize a separate handler that picks parts from processing trays and tests the picked parts.

It is desirable to provide a testing solution for SIP devices that does not utilize separate a handler separate from a tester.

It is also desirable to provide a testing solution that has a high throughput.

It is further desirable to provide a low cost testing solution that utilizes scalable handler and tester modules that are reusable for different platforms.

SUMMARY OF THE INVENTION

A method for testing System-In-Package (SIP) devices each having a plurality of electrical leads is provided in accordance with the principles of the invention. The method includes the steps of:

receiving the SIP devices in industry standard device processing trays having a plurality of SIP device receiving cells;

forming a stack of the trays of SIP devices;

orienting the stack of the trays such that contacts on each of the devices are in a predetermined orientation;

providing a test hive having a plurality of test circuits corresponding in number to at least a predetermined portion of the cells and providing a plurality of groups of test contacts, each group of test contacts being coupled to one of said test circuits and being oriented to engage the plurality of electrical leads of a SIP device disposed in a corresponding one of the cells;

moving each tray from the stack one at a time to a position proximate a test hive;

causing relative movement of the tray proximate the test hive whereby the test hive engages the tray of SIP devices and the test hive such that electrical connection is made simultaneously by each of the groups of test contacts with the electrical leads of a SIP device disposed in the corresponding one of the cells; and simultaneously electrically testing at least a predetermined portion of the SIP devices in each tray engaged by the hive.

Further in accordance with the method of the invention, the results of the testing of all SIP devices in each tray are mapped.

Still further in accordance with the principles of the invention, the method comprises:

providing the test hive with a first member configured to receive each tray engaged by the hive; and including a plurality of alignment surfaces on the first member to provide alignment of each tray engaged by the hive to adjust for dimensional tolerance differences of each the tray.

In the illustrative method of the invention the method includes: providing the hive with a base plate comprising a second plurality of alignment surfaces each associated with a corresponding one of the cells to provide alignment of each SIP device in each corresponding one of the cells.

Further in accordance with aspects of the invention, the SIP devices comprise micro SD devices.

In accordance with the principles of the invention a testing system for System-In-Package (SIP) devices each having a plurality of electrical leads is provided. The system comprises a loader module receiving a stack of industry standard device processing trays each having a plurality of SIP device receiving cells. The stack of trays is oriented such that contacts on each of the SIP devices are in a predetermined orientation. A test hive comprises a plurality of test circuits corresponding in number to at least a predetermined portion of the cells and a plurality of groups of test contacts. Each group of test contacts is coupled to one of the test circuits and is oriented to engage the plurality of electrical leads of a SIP device disposed in a corresponding one of the cells. First tray handling apparatus is configured to move each tray from the stack one at a time to a position proximate a test hive. Second tray handling apparatus causes relative movement of the tray proximate the test hive whereby the test hive engages the tray of SIP devices and the test hive such that electrical connection is made simultaneously by each of the groups of test contacts with the electrical leads of a SIP device disposed in the corresponding one of the cells. Control apparatus is provided. The control apparatus simultaneously electrically testing at least a predetermined portion of the SIP devices in each tray engaged by the hive via the test circuits.

Still further in accordance with the principals of the invention a first member is provided in the test hive to receive each tray engaged by the hive. The first member includes a plurality of alignment surfaces to provide alignment of each tray engaged by the hive to adjust for dimensional tolerance differences of each tray.

Even further in accordance with the principles of the invention the hive comprises a base plate that comprises a second plurality of alignment surfaces each associated with a corresponding one of the cells to provide alignment of each SIP device in each corresponding one of the cells.

BRIEF DESCRIPTION OF THE DRAWING

The invention will be better understood from a reading of the following detailed description of an illustrative embodiment of the invention in conjunction with the drawing figures in which like reference designations identify like elements, and in which.

DETAILED DESCRIPTION

Semiconductor products require testing at various stages of the assembly process. The test process can either be at a wafer level or package level. "Burn-in" testing can be at the wafer and package level. The methods for contacting the devices at the different stages are many. This is done both in a single device as well as devices in parallel. The need for testing more than one device at a time is driven by test time, device volume, equipment costs, etc.

At the wafer level, the contact method can either be a cantilever probe wire contact or a vertical probe such as a coil spring pogo pin. Wafer probes are used to index a wafer in x-y directions moving the wafer under a set of fixed contacts using a machine vision camera to align the wafer pads to the probe contacts. When the device is still in the wafer form, the location of the pads both within the die and from die to die is as accurate as the wafer process itself. When the probe aligns to one die, accurate, repeatable steps from one to another is all that is needed. Parallel processing of devices in a wafer is a matter of manufacturing a probe contact array which has accuracy which matches the wafer contact pattern.

At the package level, after the devices are cut and singulated from the wafer they are wire bonded to leads or connected to solder balls in the case of a BGA (ball grid array). Devices which are at a package level are usually handled and tested using test handlers which depending on the nature of the package is usually done with a pick and place handler.

During the manufacture of micro SD devices, processing trays, also referred to as component trays, in-process trays, or carrier trays are typically used throughout many phases of production for handling micro SD devices.

Figure 1:
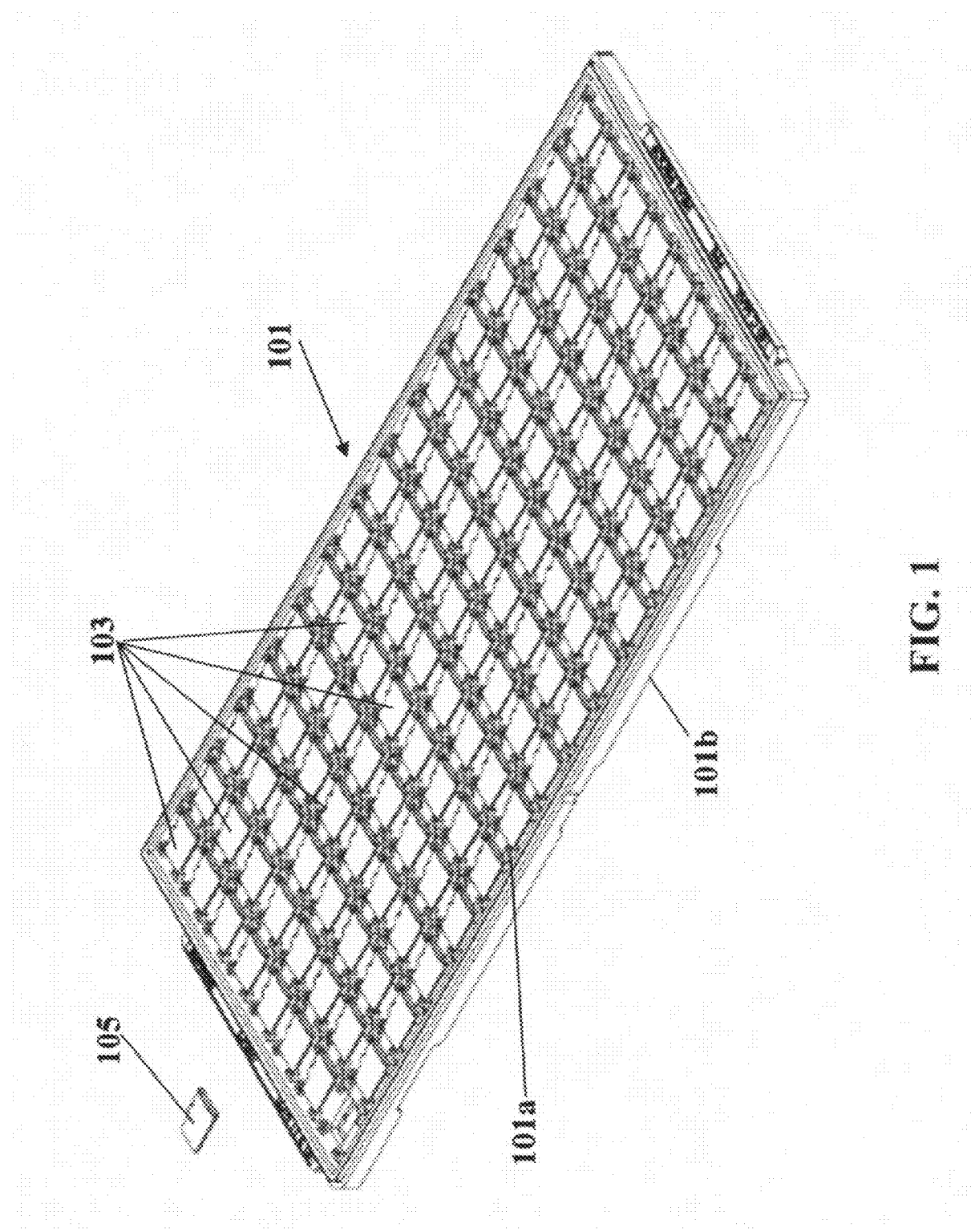
FIG. 1 illustrates a JEDEC tray with micro SD devices in a "live bug" configuration.
Figure 2:
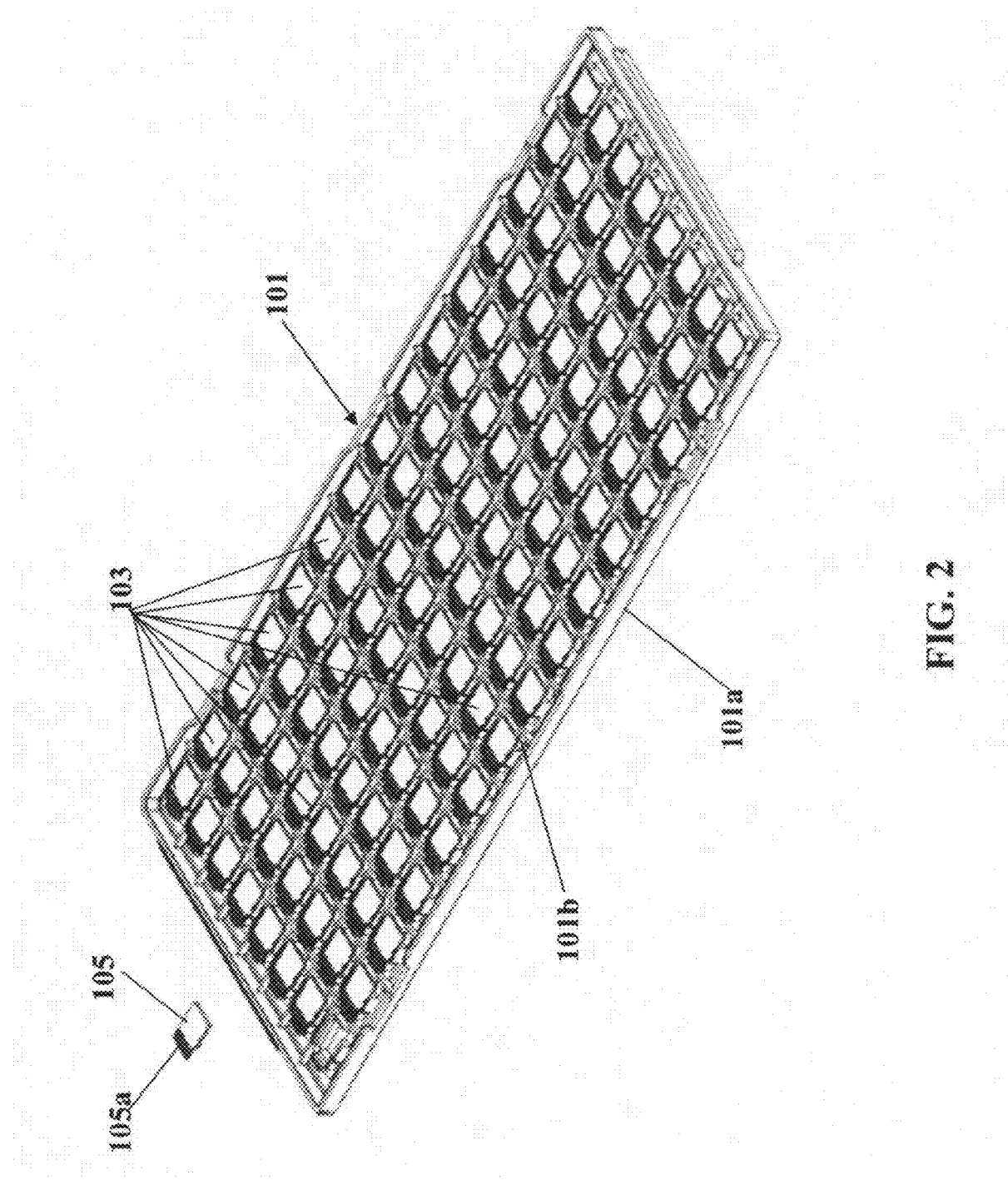
FIG. 2 illustrates a JEDEC tray with micro SD devices in a "dead bug" configuration.

A commonly used processing tray design widely used within the semiconductor industry for handling micro SD devices during production is the JEDEC tray. JEDEC trays, such as those shown in FIGS. 1 and 2, are designed and manufactured to comply with standards established by the Joint Electronic Device Engineering Counsel (JEDEC). Generally, a JEDEC tray includes a grid-like, open lattice structure that forms a planar, two-dimensional array of device cells. Each device cell is adapted to hold a single micro SD device. JEDEC trays are usually injection molded from plastic and vary in overall dimensions and grid size depending on the type of IC device the tray is designed to hold. JEDEC trays are stackable and also have surface features, such as locating and hold-down tabs, that facilitate manipulation of the trays by automatic processing and testing equipment.

Micro SD devices are placed into JEDEC trays and moved through the factory and often shipped in the JEDEC tray. These trays are considered shipping trays and have features in them which keep the parts separated from one another in a grid. Most device handlers have various input capabilities such a cassette, tube, or JEDEC tray input and output. Typical processing of micro SD devices is to unload all of the devices from the transport media, and placed into more dimensionally controlled handling assemblies such as shuttles, precisers and plungers. The micro SD device is then interfaced with an automatic test equipment (ATE) electrical tester, by being inserted into a test fixture also known as a "nest" or interposer, which also has built in alignment features which further aid in making contact with the test contacts. All micro SD devices whether good or bad are taken out of the JEDEC tray, tested, and placed back into the JEDEC tray.

Electrical testing is a procedure used to verify that micro SD devices function according to their minimum rated specifications and, in some instances, to classify devices based on their operating characteristics. In electrical testing, a more complete set of operating electrical signals is supplied to the devices to provide a thorough evaluation of their functions. After electrical testing, the devices may be sorted, based on a device's electrical characteristics exhibited under test, into categories or "bins" according to a predetermined set of performance characteristics.

Semiconductor device package orientation is usually described as either "live bug" or "dead bug" depending on which side the leads are on. The live bug orientation is an orientation in which the leads 105a that are on the bottom of the device 105 are facing downward as shown in FIG. 1. In FIG. 1 the JEDEC tray 101 has a plurality of SIP device receiving cells 103. Each device receiving cell 103 is sized to receive a device 105 which in the illustrative embodiment is in a live bug orientation. In the illustrative embodiment of the invention, device 105 is a micro SD memory.

The dead bug orientation is an orientation in which the device 105 is turned over with the leads 105a facing upward. The orientation of devices 105 in a JEDEC tray 101 is typically "live bug," because the end user of the device 105 may use a pick and place machine to place the device on a printed circuit board ("PCB").

Micro SD memory 105 devices which are "live bug" oriented in a JEDEC tray have the leads facing downward toward the tray. This makes it difficult or impossible to gain access to the contacts 105a for testing.

The design of JEDEC trays is such that each tray 101 is identical but the upper surface 101a and the lower surface 101b of each tray is configured differently. When JEDEC trays are stacked, the top tray provides additional control to the part in the lower tray, it is these features which allows the tray to be turned over, while two trays are together, basically transferring all of the devices from the bottom tray to the top tray when flipped, which then of course, becomes the new bottom tray.

When the JEDEC trays 101 are flipped, the device contacts 105a are exposed because the devices 105 are now in the dead bug orientation as shown in FIG. 2. Each JEDEC tray 101 has additional depth on the bottom of the tray, which provides addition room for alignment features to protrude into.

Micro SD device contacts can be solder balls, leads or gold contact pads 105a. The pitch of these contacts 105a can be small and also the width of the pads may be small. It is necessary to connect with each pad with a contact 105a which is connected with the tester.

A JEDEC tray 101 is usually a molded plastic tray which while being repeatable in accuracy is subject to the typical tolerance issues of a molded part such as a dirty or worn out tool set. The behavior of a molded tray 101 is that the molded part variation will also come from mold shrinkage by percentage. For a JEDEC tray 101, because of its rectangular shape, the variation is more of an issue in the x direction along the length than in the y direction along the width.

To simultaneously contact all devices 105 on a JEDEC tray 101 several tolerance stacks or build ups are taken into consideration. They are the minimum and maximum dimensions of each micro SD device, the minimum and maximum dimensions of each cell or tray pocket, as well as the minimum and maximum outer dimensions of the tray. In accordance with the principles of the invention aligning features are provided that allow for the shift which can occur as a result of all these tolerances.

Figure 3:
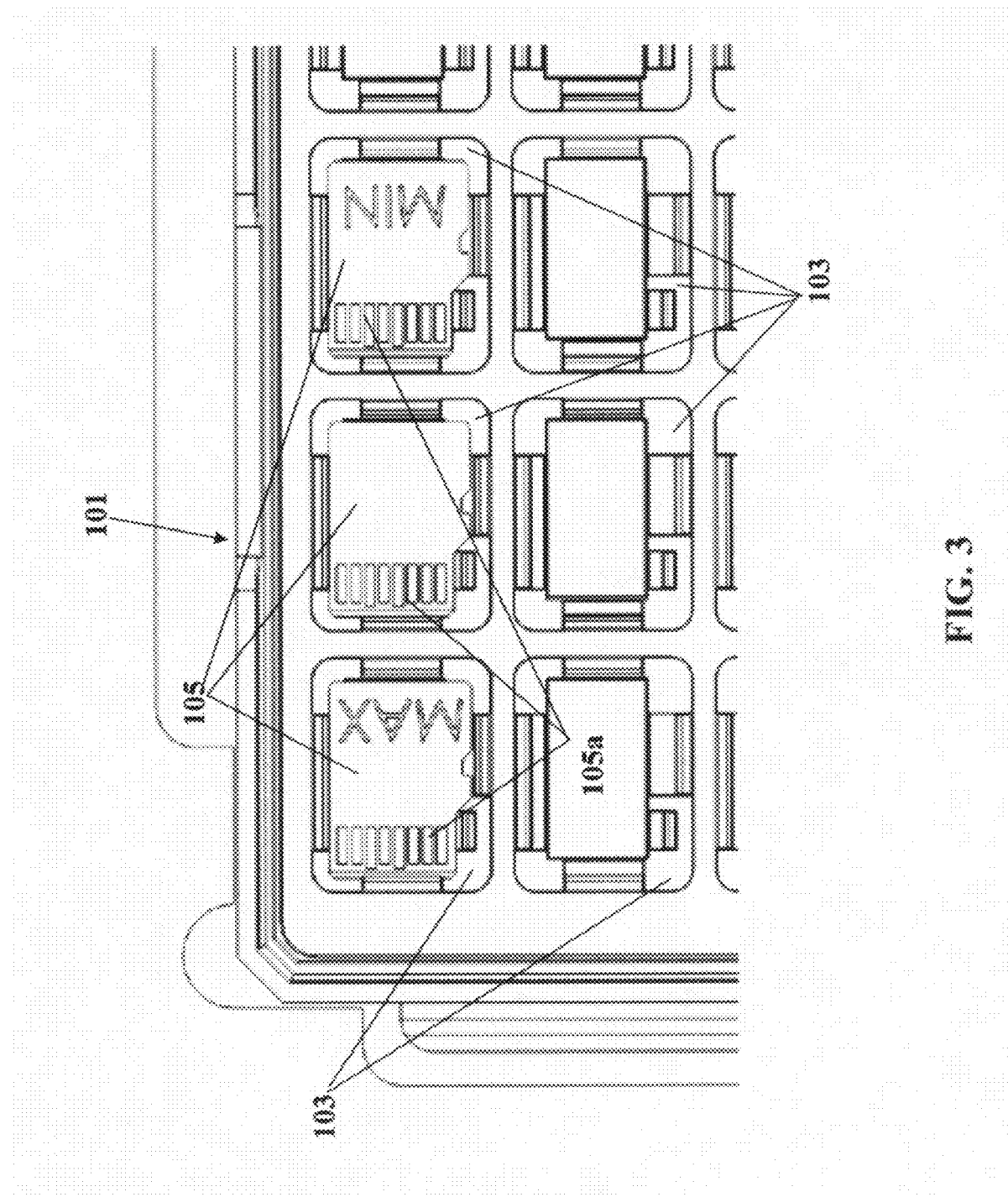
FIG. 3 illustrates a portion of a JEDEC tray partially populated with micro SD devices.
Figure 4:
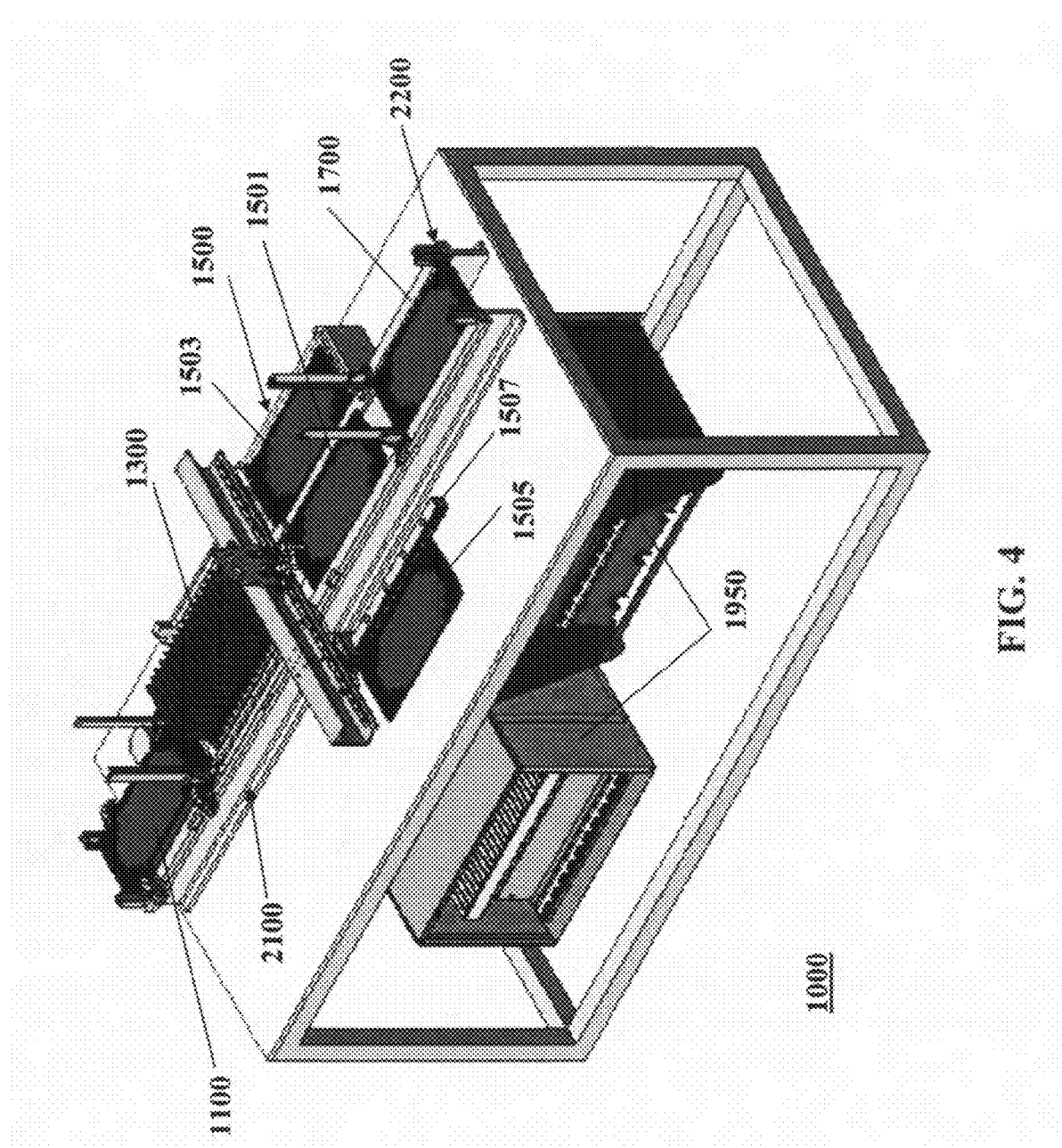
FIG. 4 is a perspective view of a system in accordance with the principles of the invention.
Figure 5:
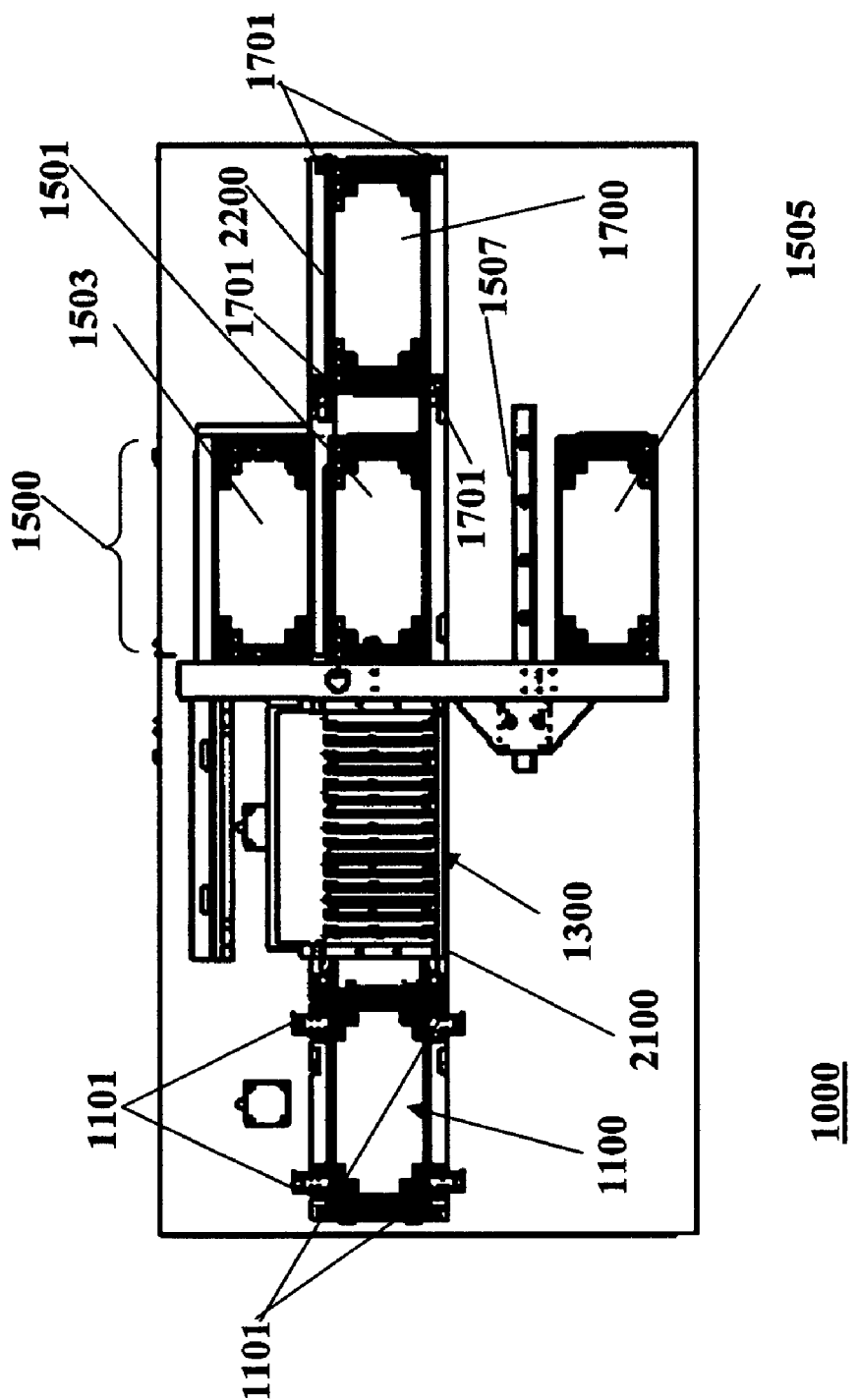
FIG. 5 is a top view of the system of FIG. 4.

FIG. 3 shows a JEDEC trays 101 with cells 103 for micro SD devices 105 that are in a dead bug orientation with contacts 105 on the top and also showing minimum sized, nominally sized and maximum sized micro SD devices 105.

FIGS. 4 through 7 show different views of a system 1000 in accordance with the principles of the invention that provides for testing in JEDEC trays of micro SD devices, in which a whole tray of devices is tested without removal of the micro SD devices from the tray.

System 1000 includes loader module 1100, a tester module or hive 1300, a sorter module 1500, un-loader module 1700 and tray handlers 1900. A first transport arrangement 2100 is provided to move trays for the loader module 1100 to hive 1300 and from hive 1300 to sorter module 1500. A second transport arrangement 2200 is provided to move trays from sorter module 1500 to un-loader module 1700. It will be appreciated by those skilled in the art that the first and second transport arrangements may be combined into or replaced by a single transport unit in alternate embodiments of the invention.

Figure 21:
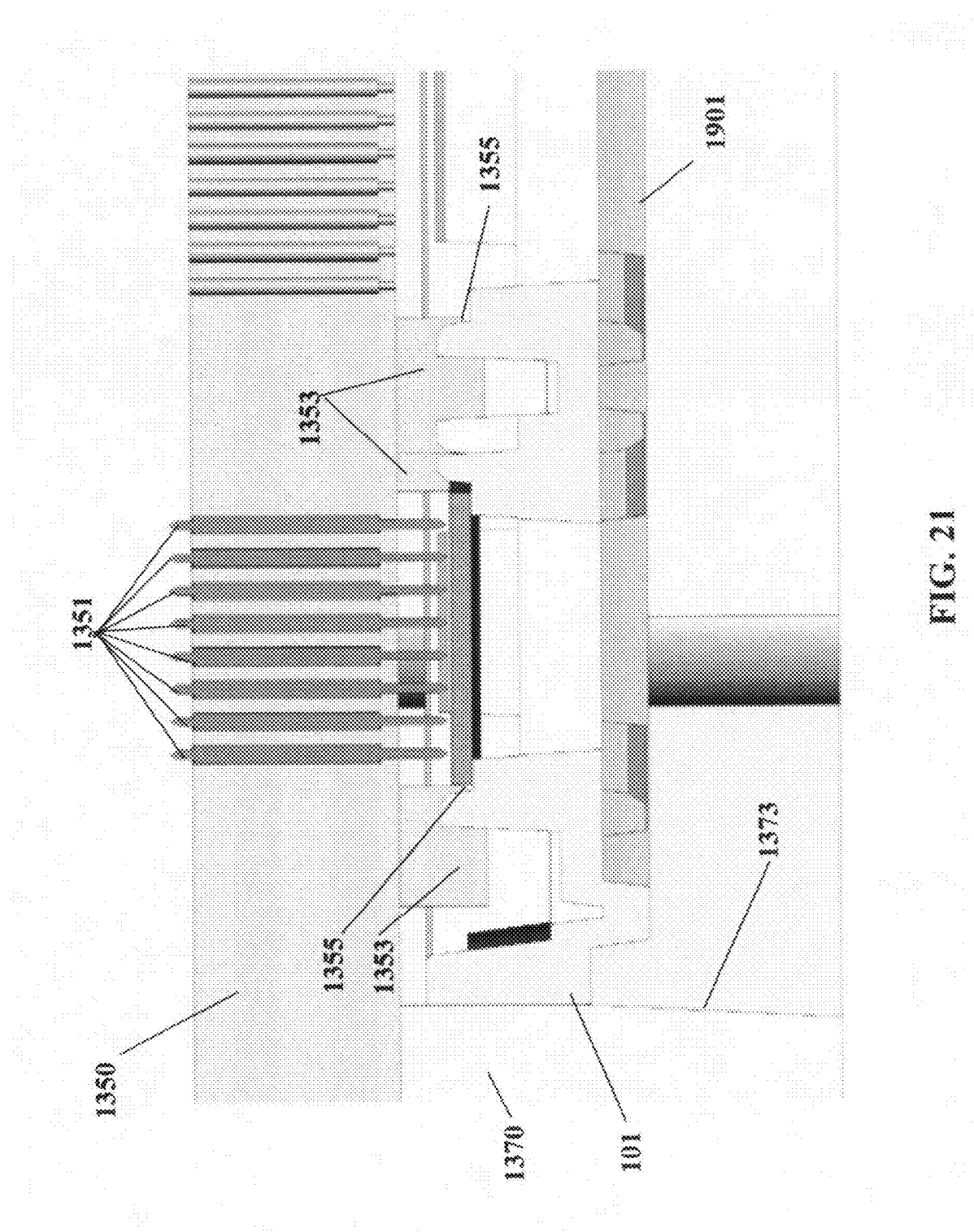

JEDEC trays are loaded as a stack onto loader module 1100. Loader module 1100 includes vertical supports 1101 that position the stack of JEDEC trays. Disposed below the vertical supports is the first transport arrangement 2100 as shown best in FIGS. 21 and 22. First transport arrangement is a conveyer type transport that comprises rails 2101 and 2103. Rail 2101 includes a flange 2105. Rail 2103 includes a flange 2107. Flanges 2105 and 2107 form a track upon which JEDEC trays are moved from the loader module 1100 to a position disposed below hive 1300. Flanges 2105 and 2107 are disposed below the top surface of rails 2101 and 2103, respectively.

A pair of belts 2109, 2111 are disposed below and proximate to flanges 2105 and 2107, respectively. Each belt 2109, 2111 carries tabs 2115, 2117 extending vertically therefrom and of such a length so as to extend above flanges 2105, 2107 and to engage the end of a JEDEC tray 101 supported by flanges 2105, 2107. With this arrangement, static electricity buildup is minimized since a common source of static electricity buildup in conveyor transport of trays.

Disposed below loader module 1100 is a first tray handler 1900. First tray handler 1900 is described in greater detail below. First tray handler 1900 includes a lift plate 1901 that is raised and lowered by motor 1909. Lift plate 1900 is sized such that it fits between flanges 2105, 2107.

When a stack of JEDEC trays is placed onto loader module 1100, the bottom of the stack of trays rests on solenoid actuated blade supports 1102, each disposed on a corresponding one vertical support 1101. Only blade supports 1102 on the rear vertical supports 1101 are shown in the drawings. When a tray is to be moved from the loader module, first tray handler 1900 is actuated so as to raise plate 1901 into engagement with the bottom of the lowest tray in a stack. Blade supports 1102 then retract. The bottom tray is lowered by first tray handler onto flanges 2105, 2107. As the bottom tray is lowered by first tray handler 1900, blade supports 1102 are operated to engage and support the tray above the bottom tray.

After the bottom tray is lowered onto flanges 2105, 2107, the tray will be moved into position below hive 1300 by tabs 2117 engaging the rear of the tray and sliding the tray into position below hive 1300.

Tester module or hive 1300 and its key component elements are shown in FIGS. 11 through 18. Hive 1300 includes tester 1310, contactor base 1350 and outer frame 1370.

The construction of hive 1300 is in a downward facing configuration to allow a JEDEC tray 101 to be raised into the hive 1300 or alternatively hive 1300 can be lowered over tray 101. Outer frame 1370 has a tray receiving cavity 1371 with tapered inside edges 1373 to guide the outside edges of the tray 101 to allow for a medium alignment of the devices 105.

Frame 1370 is mounted to a contactor base 1350 which is non-conductive material. Contactor baser 1350 has contacts mounted within. Each contact, better seen in FIGS. 19 through 22 is a "Pogo" pin 1351. Each Pogo pin 1351 is a spring loaded contactor pin of a type known in the art. Pogo pins 1351 are arranged in a matrix arrangement that corresponds to the placement of device leads 105a for a fully populated JEDEC tray 101.

An array of fine alignment features are integrated into base 1350 to provide the final alignment of all of the devices 105 to contacts 1351. Specifically, guide pins 1353 having guide surfaces 1355 are disposed so as to be in alignment with each cell 103 of a JEDEC tray 101 and to urge each corresponding device 105 to a predetermined position regardless of the tolerance dimensions of the JEDEC tray 101 or the tolerance dimensions of each device 105. Contactor base 1350 includes slots 1357 on its surface that is proximate JEDEC trays 101.

Figure 23:
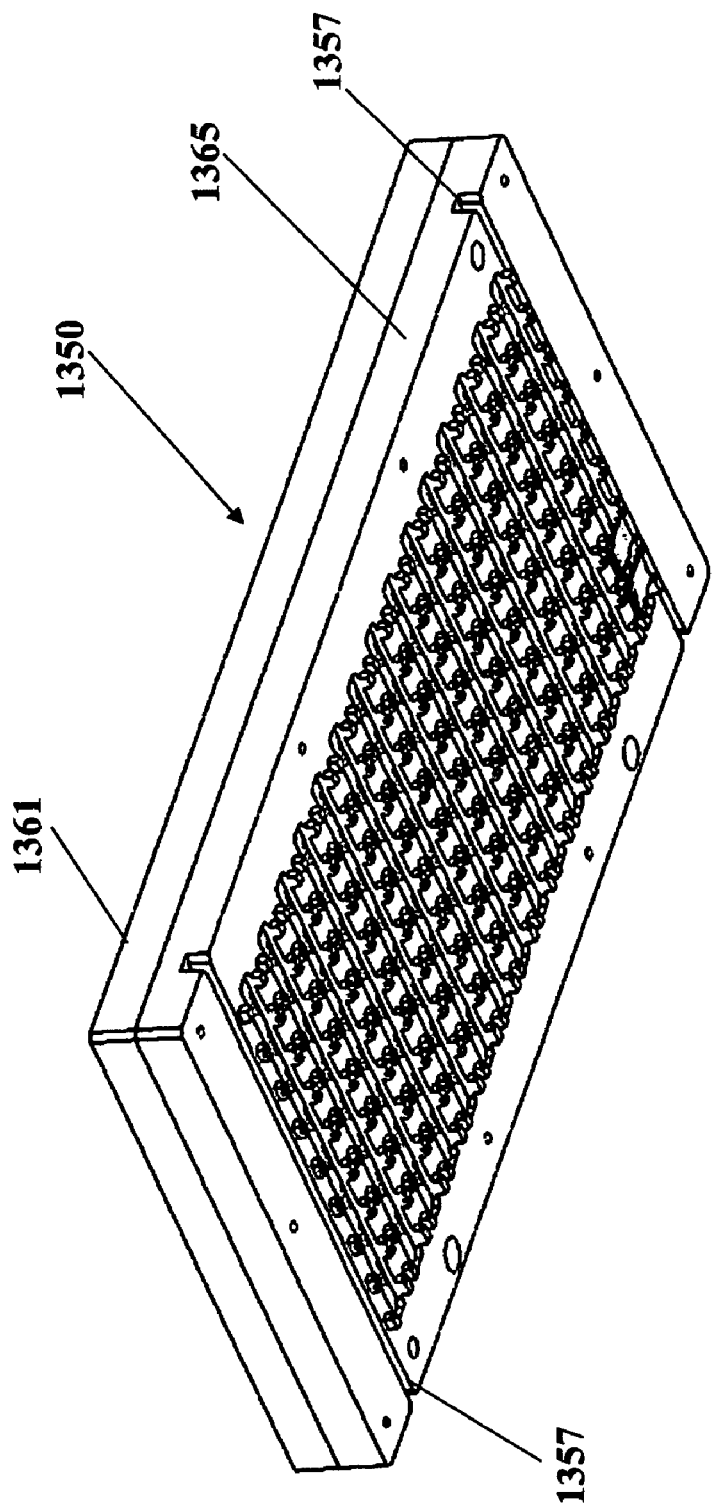
FIG. 23 is a bottom perspective view of an alternate portion of the hive assembly.
Figure 24:
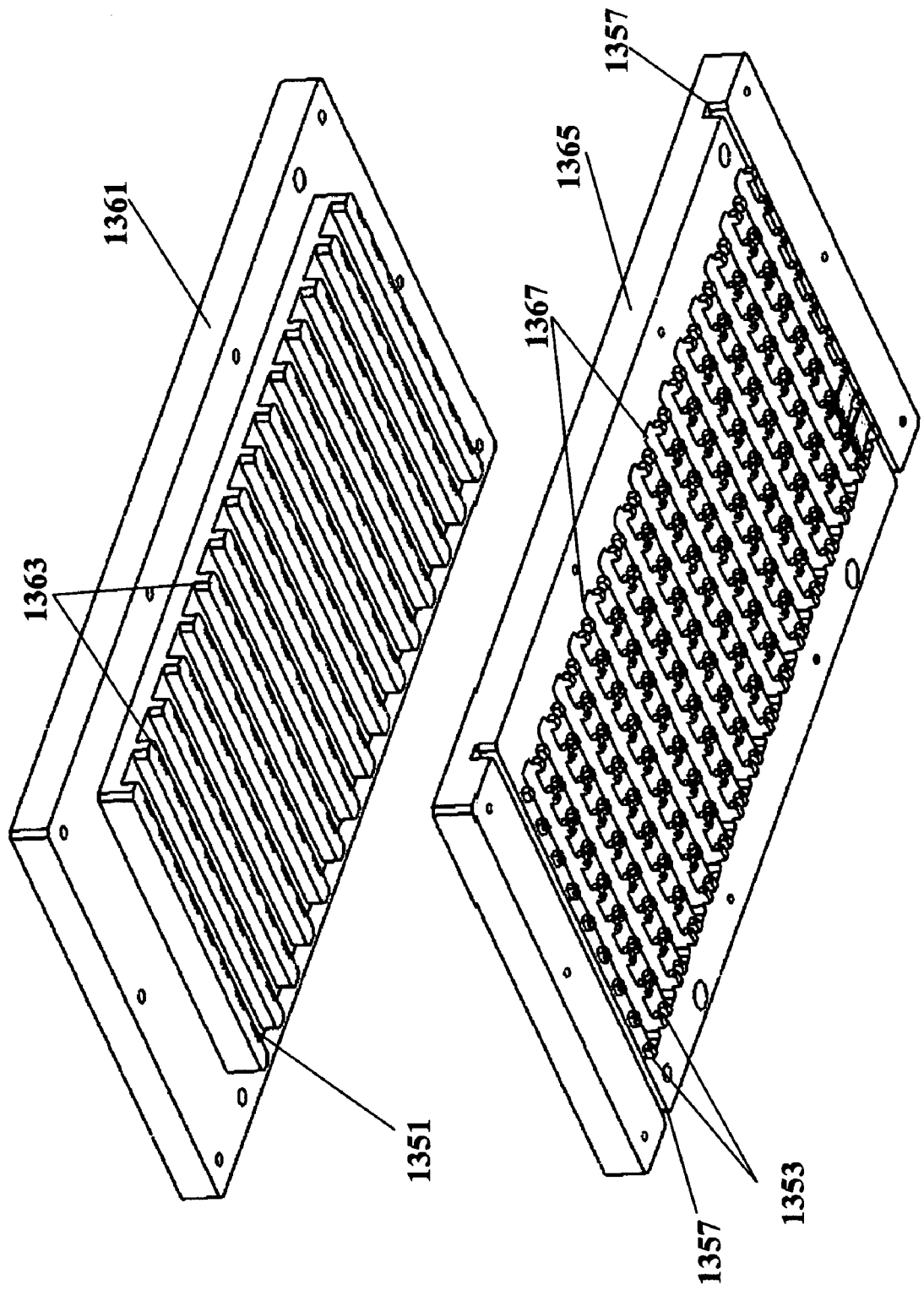
FIG. 24 is an exploded bottom perspective view of the alternate portion of FIG. 23.

An alternate embodiment of the contactor base 1350 is shown in FIGS. 23 and 24. In this alternate embodiment, contactor base 1350 is of two-piece construction comprising an insulating or first base portion 1361 carrying the contactors or "Pogo" pins and a preferably metallic second base portion 1365 that has alignment pins 1353 carried thereon. First base portion 1361 includes rows of downwardly extending ribs 1363. Each rib 1363 carries a plurality of groups of contactor or "Pogo" pins 1351 and provides an insulating support for the pins. Second base portion 1365 includes a plurality of elongated apertures or through slots configured and sized to receive the ribs 1363. Second base portion 1365 includes alignment pins 1353 integrally formed thereon. One advantage of the embodiment shown in FIGs. and 24 is that the life of contactor base 1350 is improved by utilizing a metallic portion so that wear effects on alignment pins 1353 is reduced.

Figure 8:
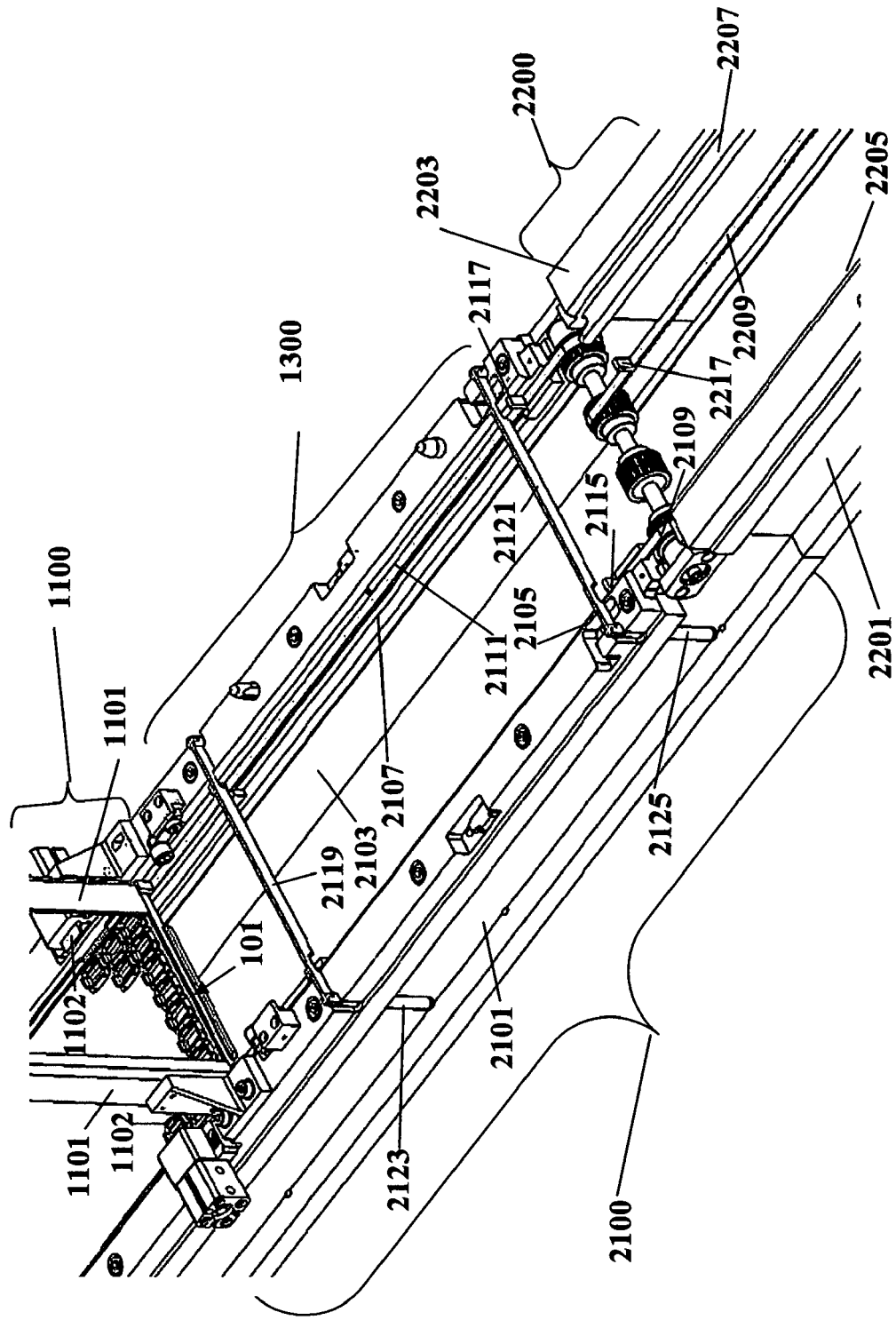
FIG. 8 is a perspective view of the tray transport arrangement.
Figure 9:
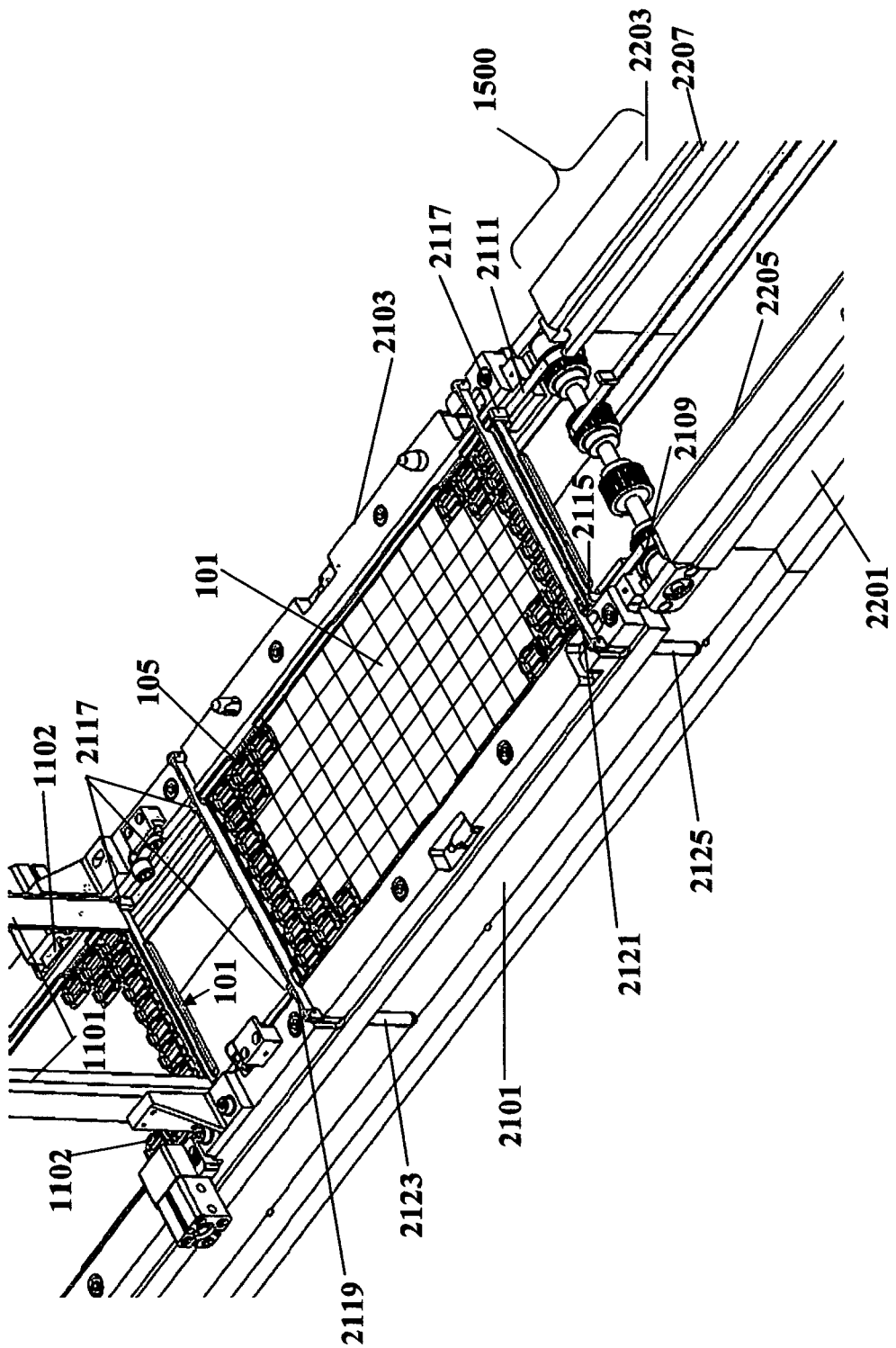
FIG. 9 is a perspective view of the tray transport arrangement showing two JEDEC trays in positions.
Figure 10:
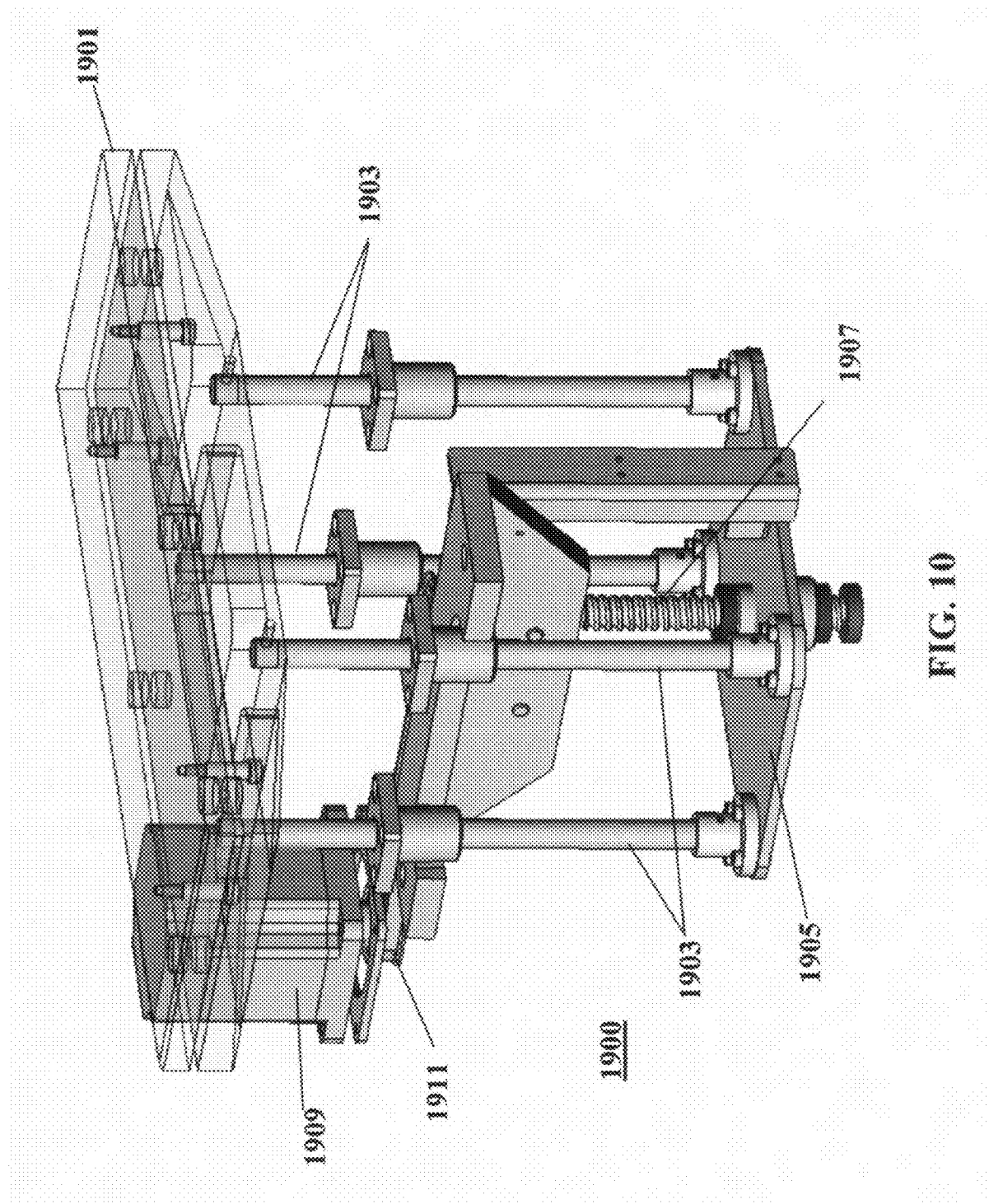
FIG. 10 is a perspective view of a portion of the system of FIG. 4.

Second base portion 1365 also includes slots 1357 that are utilized to provide clearance for tray retainers 2119 and 2121 shown in FIGS. 8 and 9.

A JEDEC tray 101 populated with micro SD devices 105 in a dead bug configuration is raised by a second tray handler 1900. Second tray handler 1900 raises JEDEC tray 101 as shown in FIGS. 19 through 22 so that the tray with the devices 105 to be tested is first moved into position by edges 1373 of tray 1370. As JEDEC tray 101 is raised by tray handler 1900 to a test position, each device 105 to be tested is moved to a predetermined position by guide surfaces 1355 of guide pins 1353 as most clearly seen in FIGS. 19 and 20.

Figure 22:
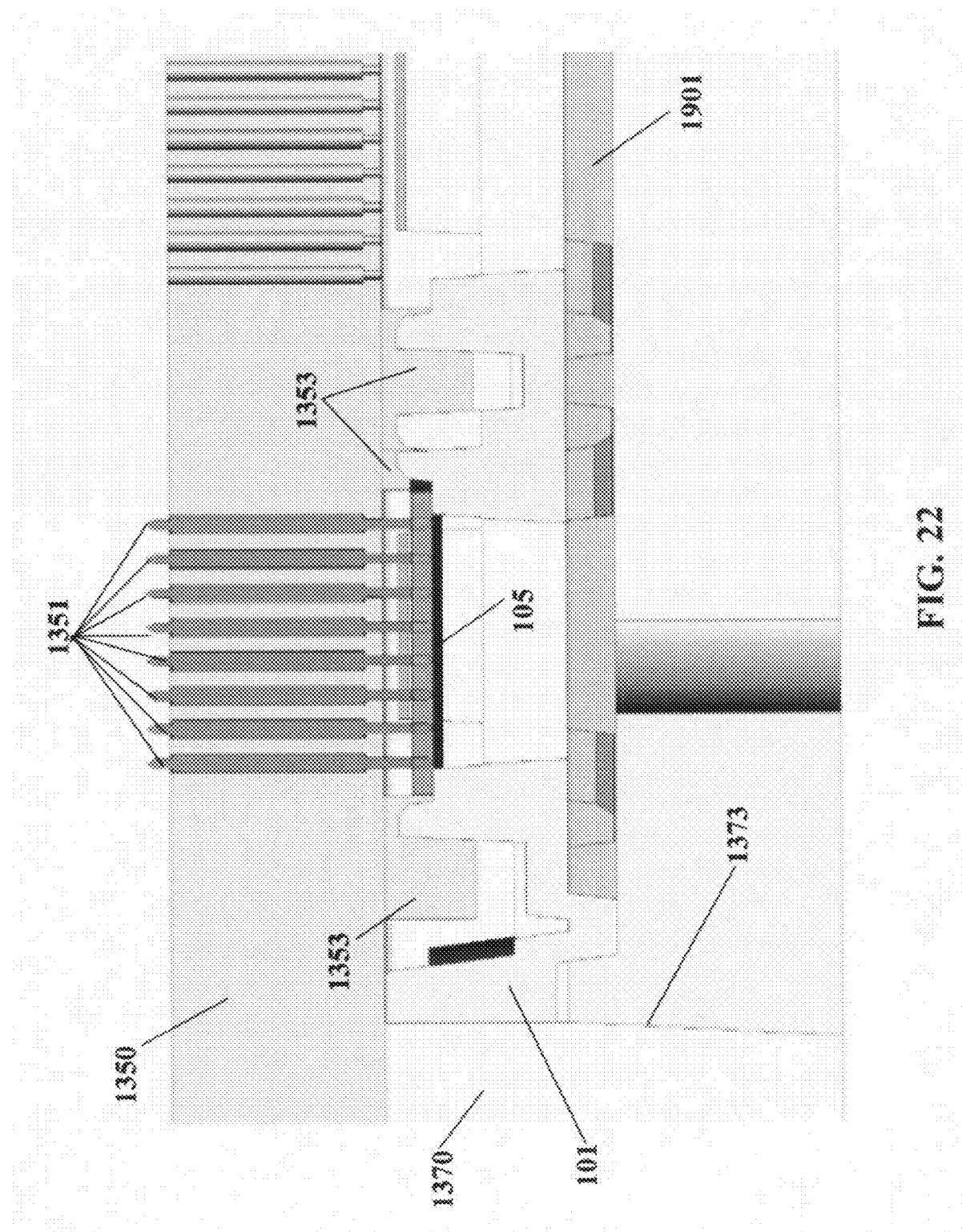

As most evident in FIG. 22, tray handler 1900 raises JEDEC tray 101 to a device test position at which all Pogo pins 1351 carried by contactor base 1350 engage contacts 105a of each device 105. Each Pogo pin 1351 is compressed and electrical contact is made by each Pogo pin 1351 to the corresponding contact 105a. Tray handler 1900 provides pressure to the bottom of JEDEC tray 101 that is equivalent to the force required to compress Pogo pins 1351. With the configuration provided, each Pogo pin 1351 contacts its corresponding device 105 at the same time.

Figure 11:
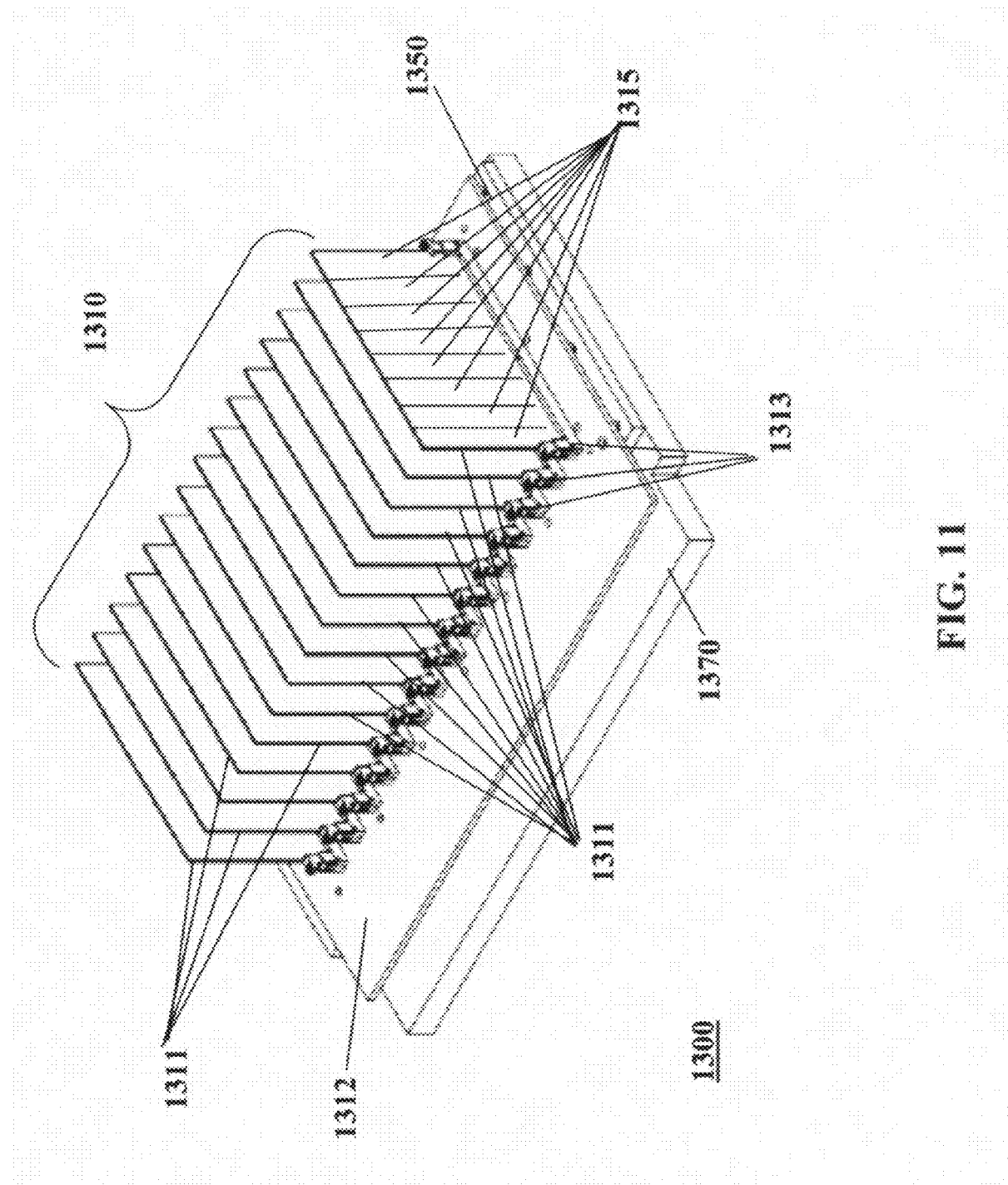
FIG. 11 is a perspective view of the hive assembly of the system of FIG. 6.
Figure 12:
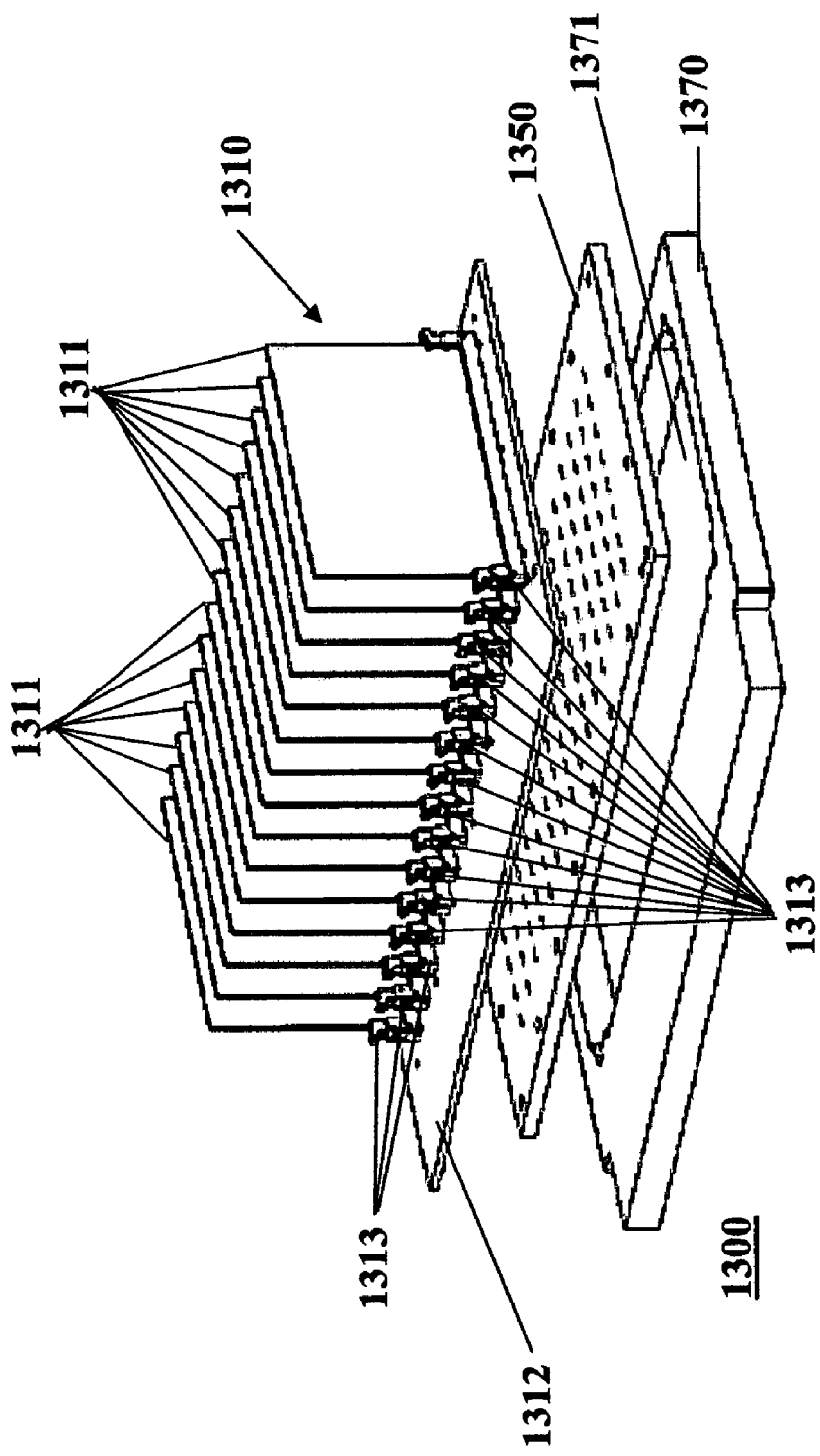
FIG. 12 is an exploded perspective view of the hive assembly.
Figure 13:
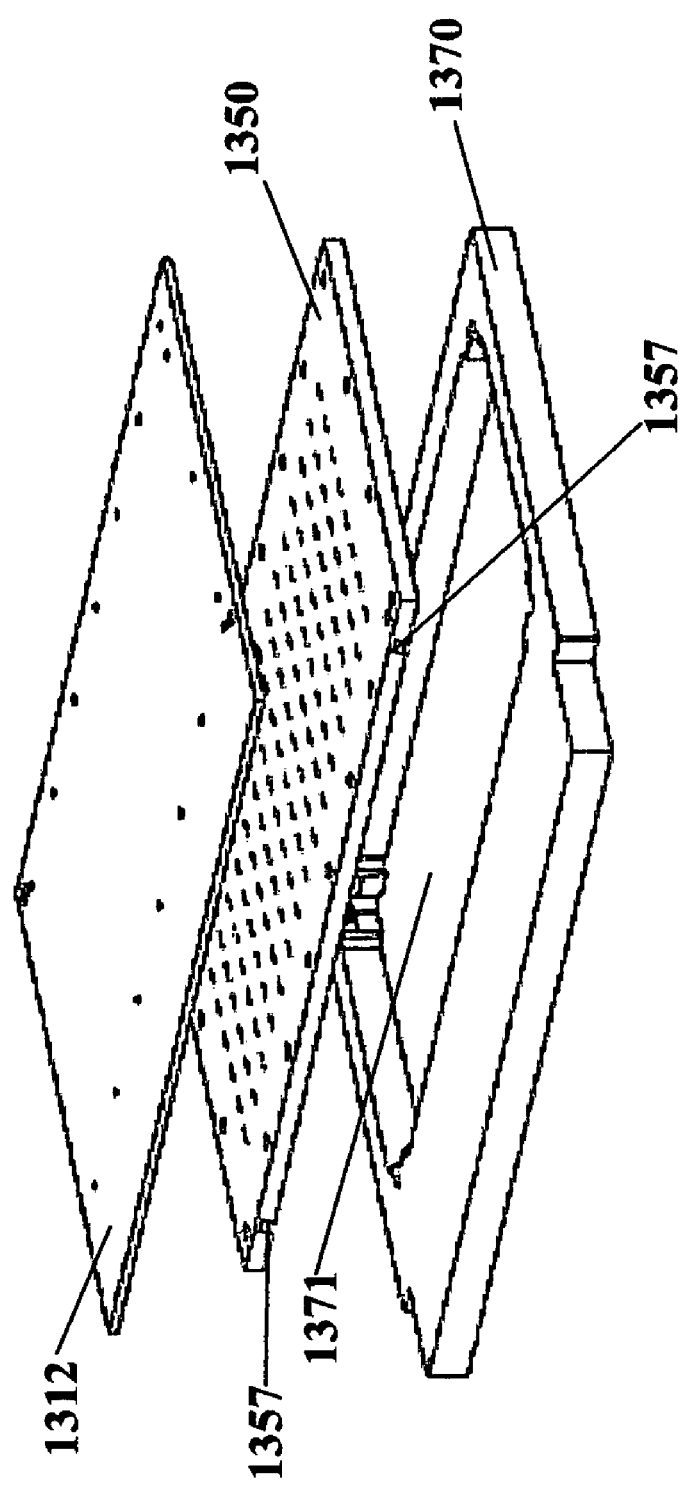
FIG. 13 is an exploded perspective view of a portion of the hive assembly.
Figure 14:
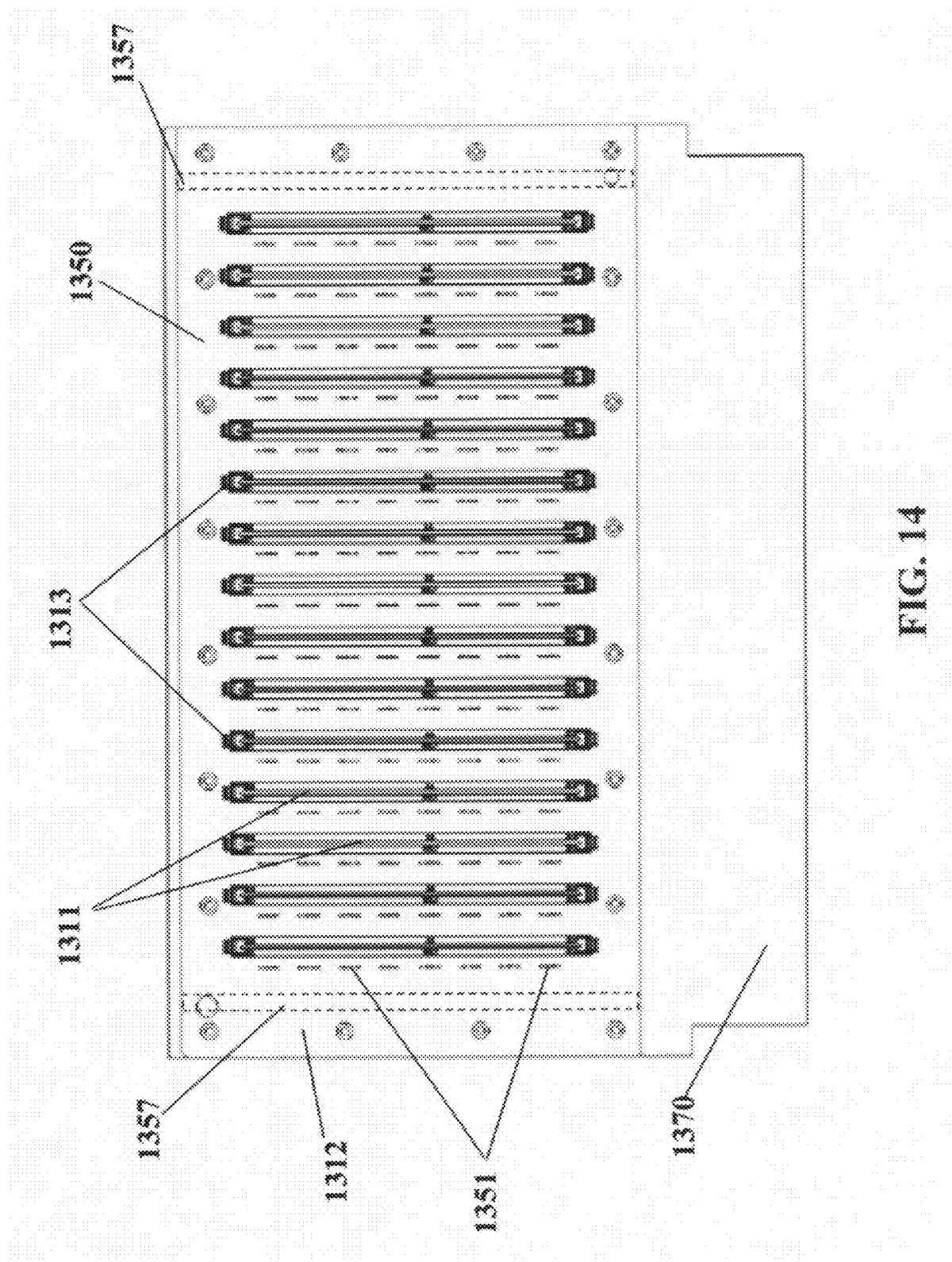
FIG. 14 is a top planar view of the hive assembly.
Figure 15:
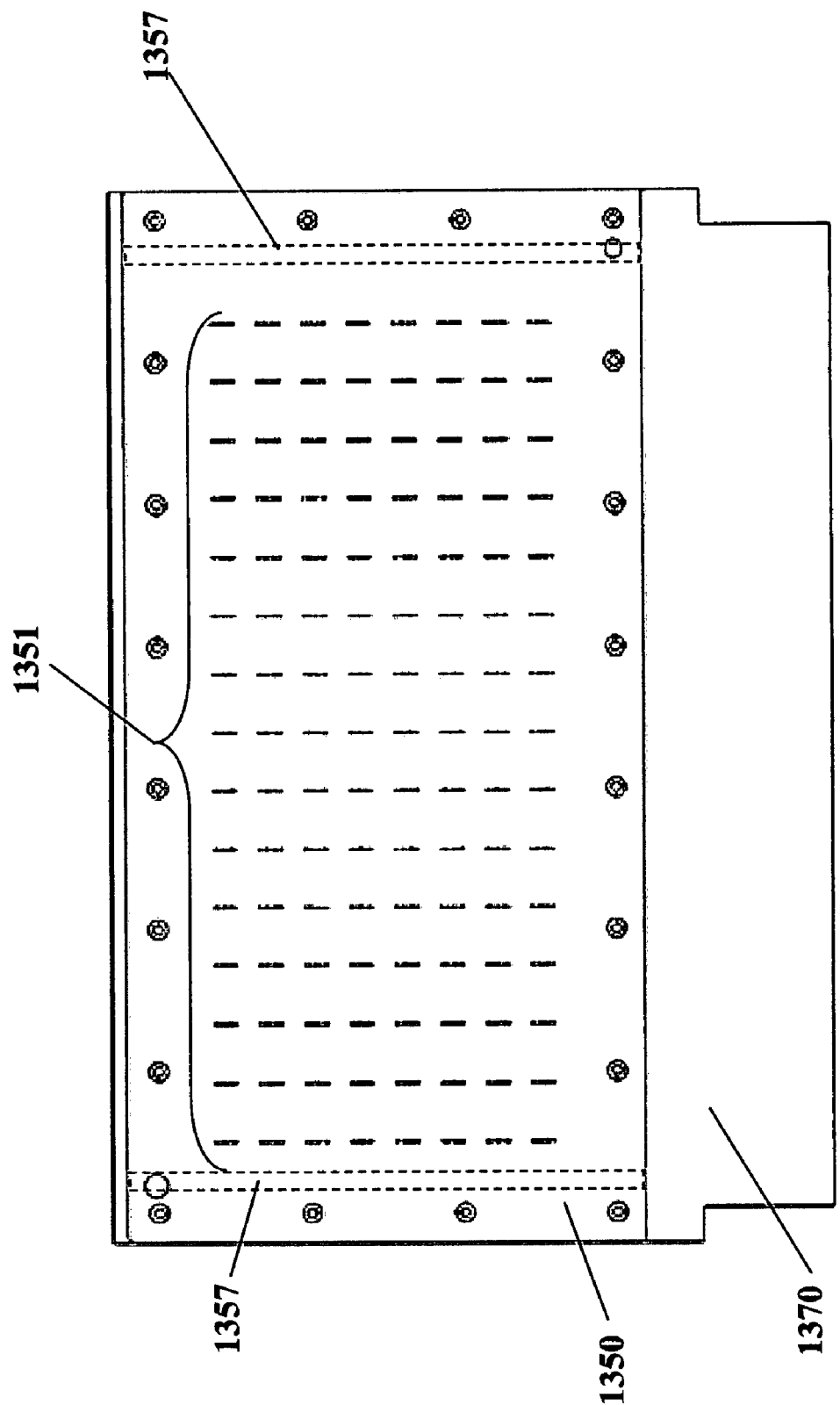
FIG. 15 is a top planar view of the pogo pin board of the hive assembly.
Figure 16:
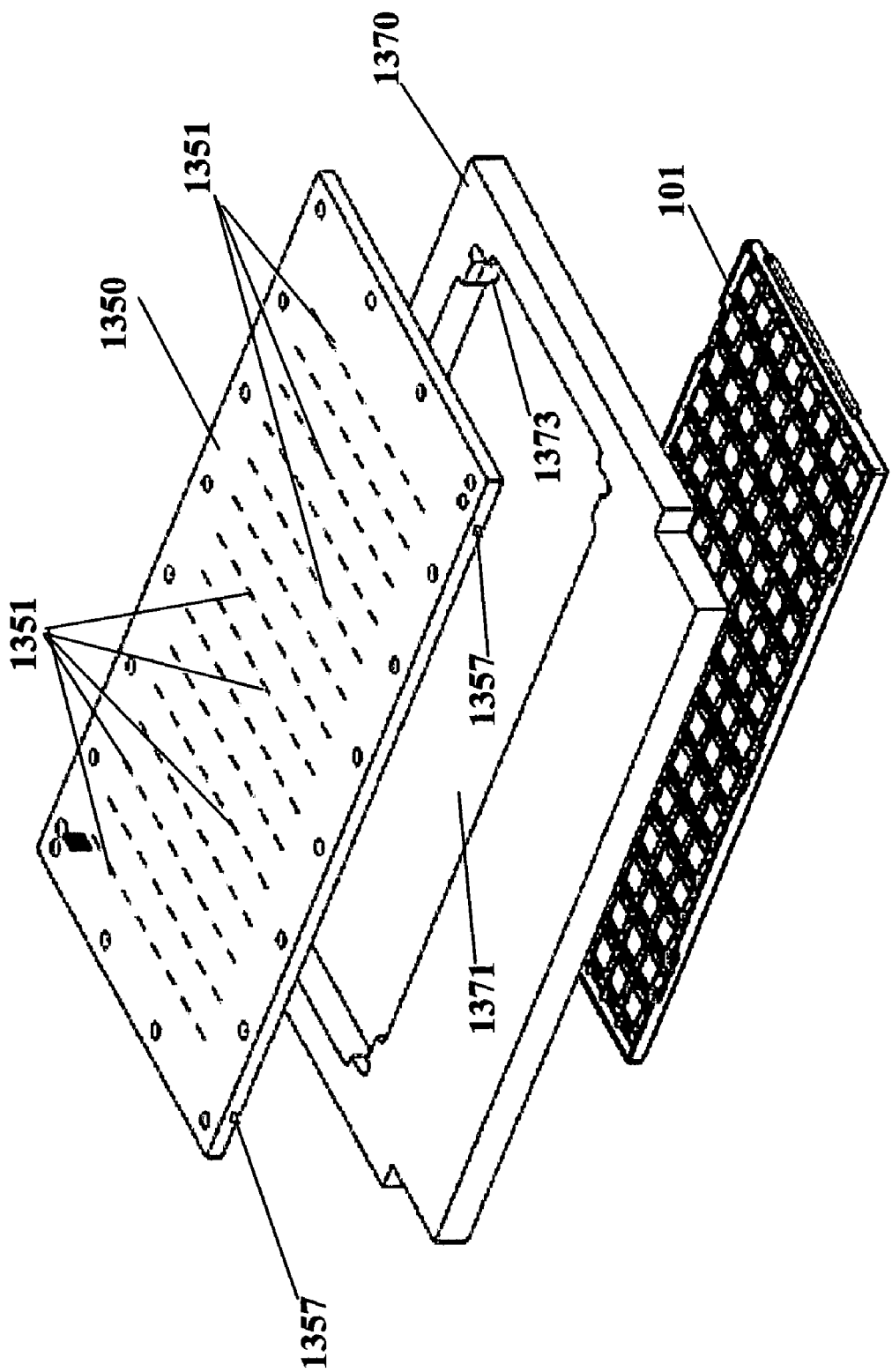
FIG. 16 is an exploded perspective view of a portion of the hive assembly.
Figure 17:
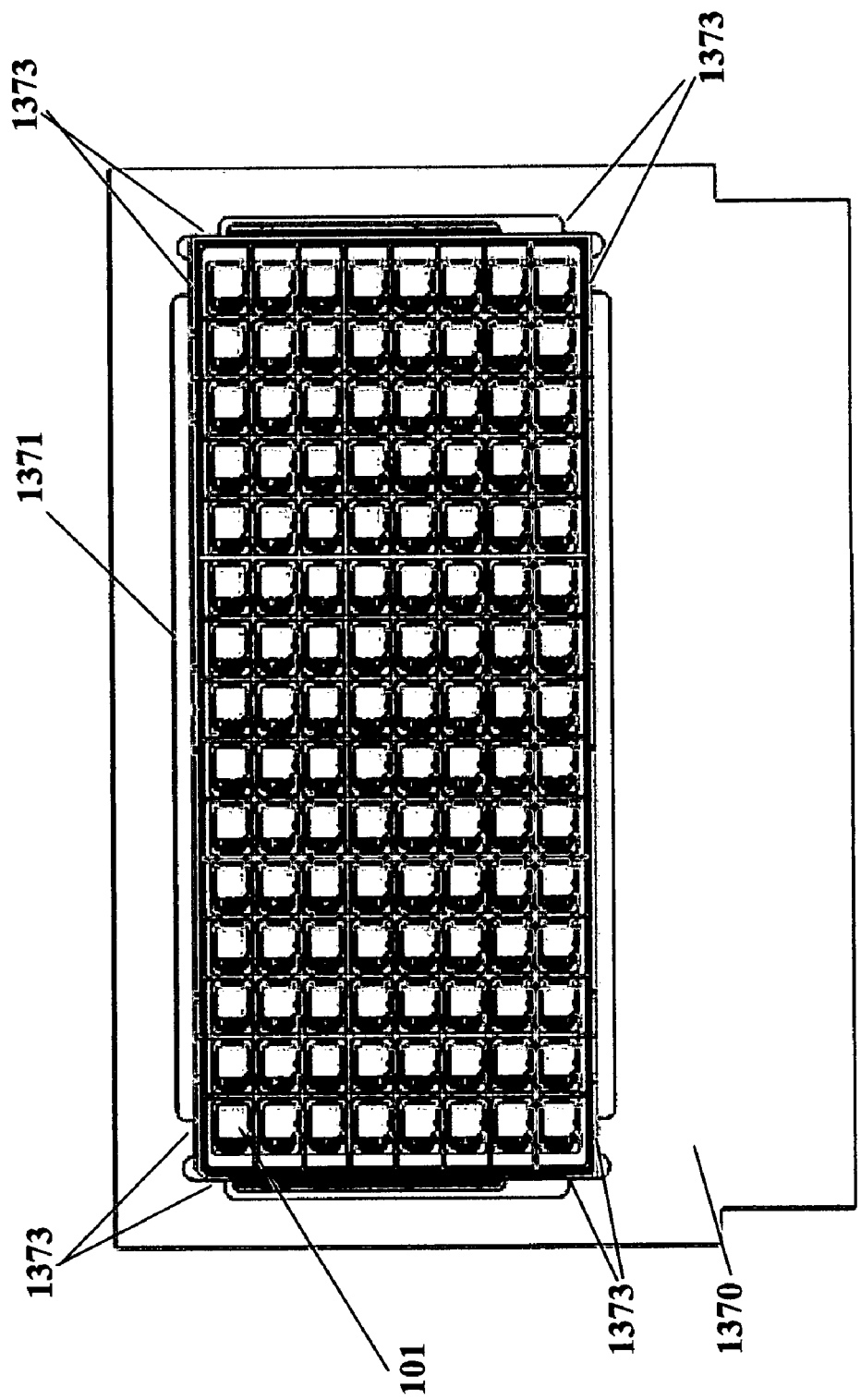
FIG. 17 is top view of a portion of the hive assembly with a JEDEC tray.
Figure 18:
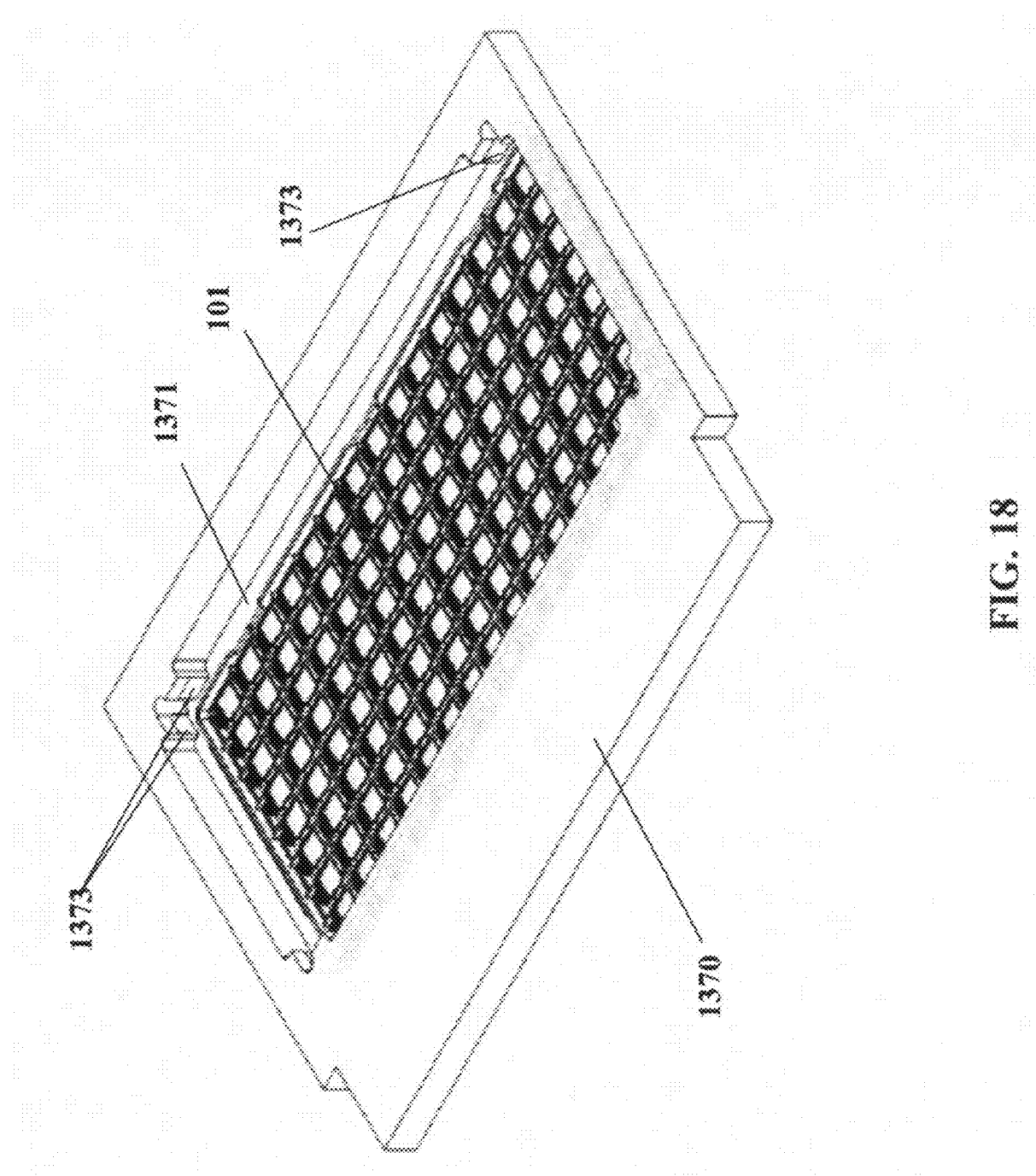
FIG. 18 is a perspective view of a portion of the hive assembly with JEDEC tray.
Figure 19:
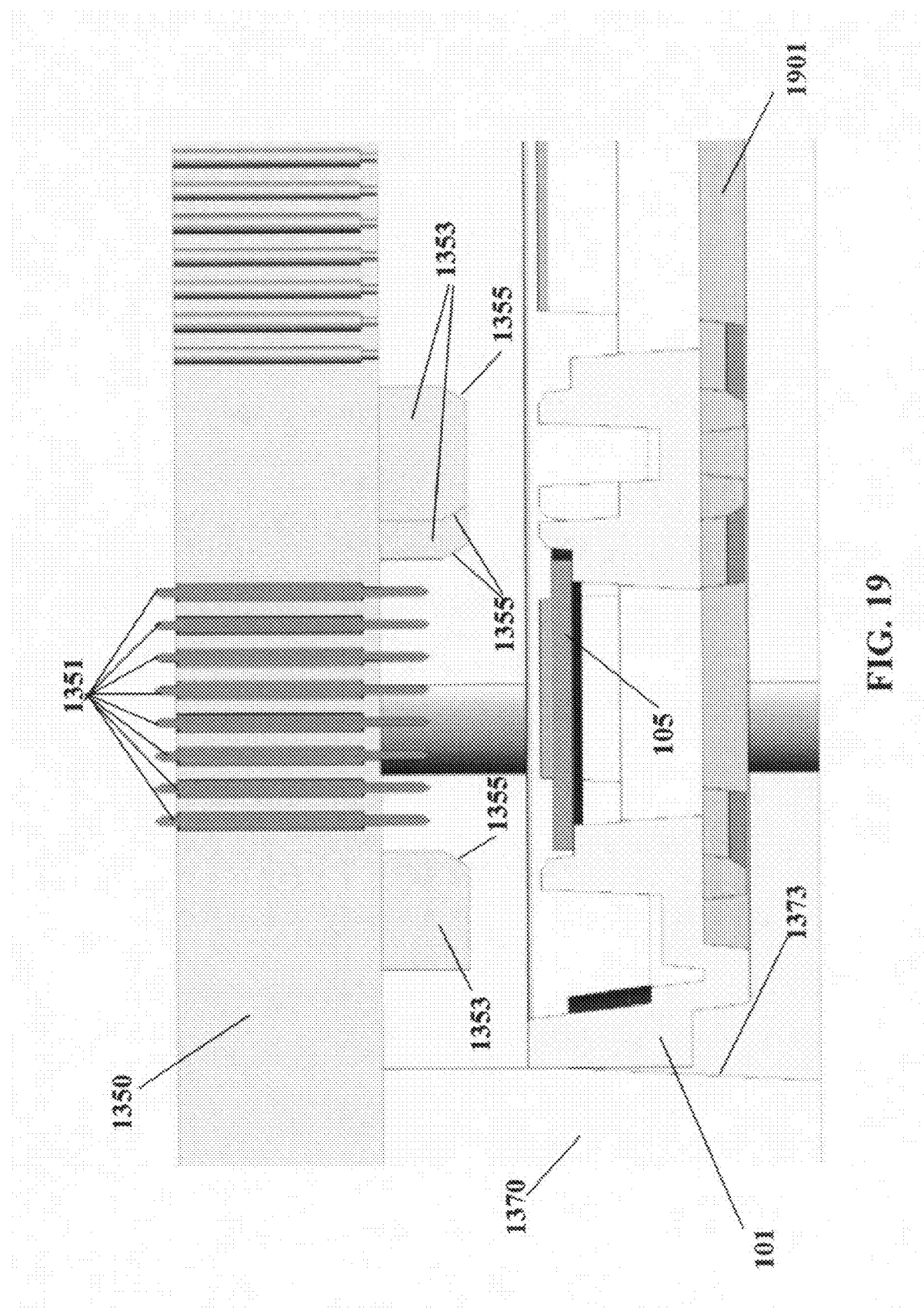
FIGS. 19-22 show operation of a portion of the hive assembly in close up.
Figure 20:
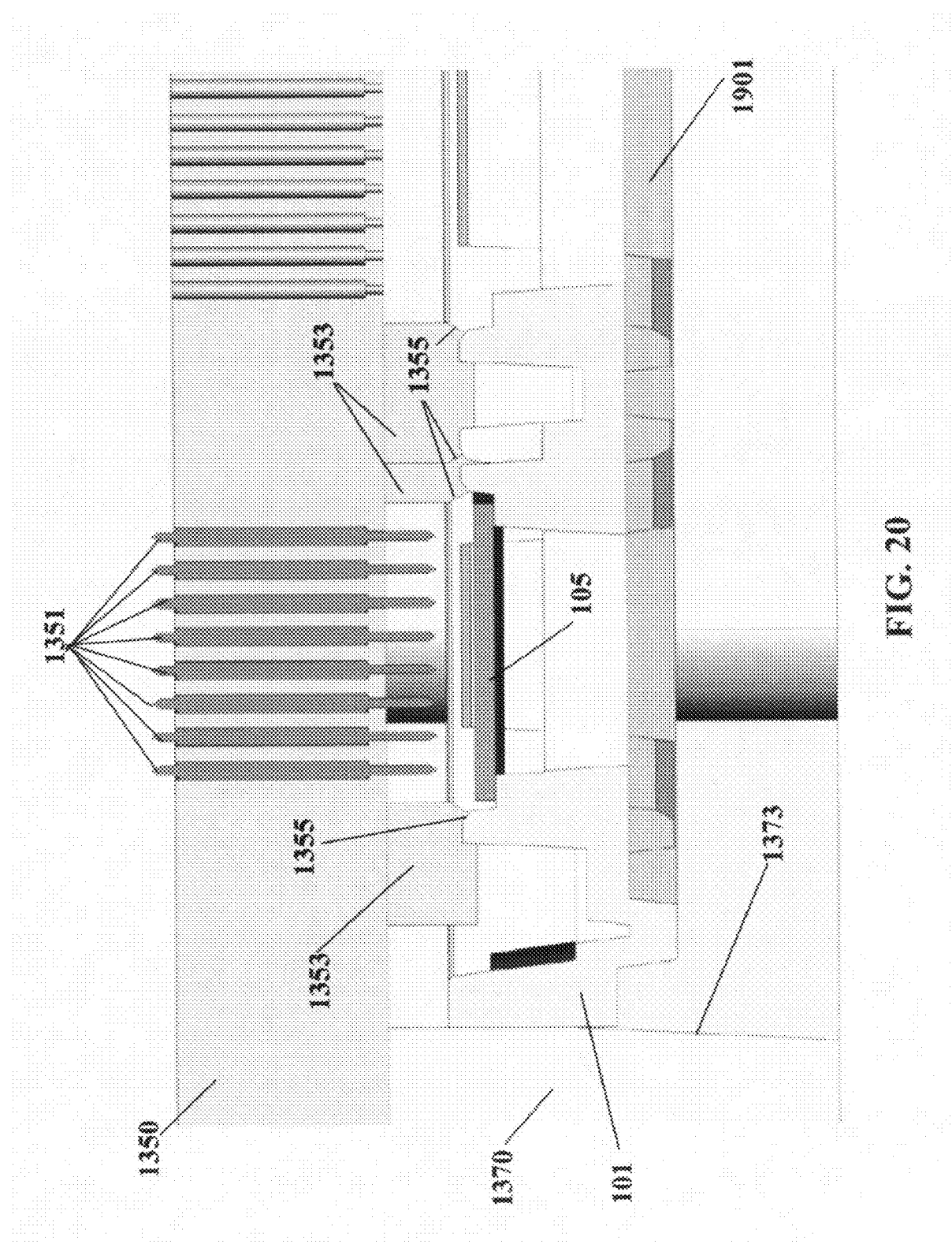

Once JEDEC tray 101 is moved to the test position, all devices 105 in JEDEC tray 101 are tested simultaneously. Testing of devices 105 is performed by utilizing tester 1310. Tester 1310 as best seen in FIGS. 11 and 12 includes a plurality of test modules 1311. The test modules 1311 each are carried in a connector 1313. Each connector 1313 is carried on a circuit board 1312. The number of test modules 1311 and the number of connectors 1313 carried on circuit board 1312 correspond to the number of rows of cells 103 of the JEDEC tray 101. Each connector 1313 is connected to corresponding groups of Pogo pins 1351 via metallic traces carried on circuit board 1312. Each group of Pogo pins corresponds, in turn, to a corresponding cell 103 in a row.

Each test module 1311 comprises a circuit board that includes a second plurality of identical electronic circuits 1315. Each circuit 1315 is identical and is configured to test one device 105 carried in JEDEC tray 101. The number of circuits 1315 carried by a test module 1311 is equal to the number of cells 103 in a row of JEDEC tray 101. By way of example, JEDEC tray 101 shown in the drawings is arranged as 15 rows of cells, each row containing eight cells. The corresponding tester 1310 shown in the drawing figures includes fifteen test modules 1311 and each test module 1311 includes eight circuits 1315.

Advantageously, the test hive 1300 is utilized to test all the devices 105 carried in a standard JEDEC tray 101 with the devices in the tray.

First transport arrangement 2100 includes retainer bars 2119, 2121. Each retainer bar 2119, 2121 is positioned so that when a tray 101 is positioned below test hive 1300, retainer bars 2119, 2121 will engage the upward facing surface of the tray as the tray is raised into a testing position by second tray handler 1900. Retainer bars 2119 and 2121 are retained in position by guide pins 2121, 2125, respectively. Although not seen in the drawing figures, each retainer bar 2119, 2121 has a pair of guide pins 2121, 2125 with each guide pin in a pair being disposed on opposite ends of retainer bars 2119, 2121. Guide pins 2121, 2125 are biased to a position such that as second tray handler 1900 raises a tray, retainer bars 2119, 2121 provide forces against the tray to urge the tray into contact against plate 1901 of second tray handler 1900. Contactor plate 1350 includes grooves 1357 which receive retainer bars 2119, 2121 such that retainer bars 2119, 2121 do not interfere with "Pogo pins" 1351 carried by contactor plate 1350. Retainer bars 2119, 2121 assure that any warpage in trays 101 is eliminated by urging the trays against plate 1901 and also assure that each tray cleanly disengages from contact with contactor plate 1350 upon completion of testing.

Turning back to FIGS. 6 through 9, test system 1000 receives a stack of JEDEC trays. The stack if JEDEC trays 101 are turned upside down so that the device configuration in each of the trays is a dead bug configuration. In the illustrative embodiment of the system, each device is a micro SD device. The upside down stack of JEDEC trays is loaded into a loader module 1100. A tray handler 1900 is disposed below loader module 1100 and is utilized to transfer JEDEC trays, one at a time to test hive 1300. Test hive 1300 in system 1000 is stationary. When a tray 101 is moved to position under hive 1300, a second tray handler 1900 is utilized to raise JEDEC tray 101 into engagement with the test hive 1300 whereupon testing of all devices is initiated.

Figure 6:
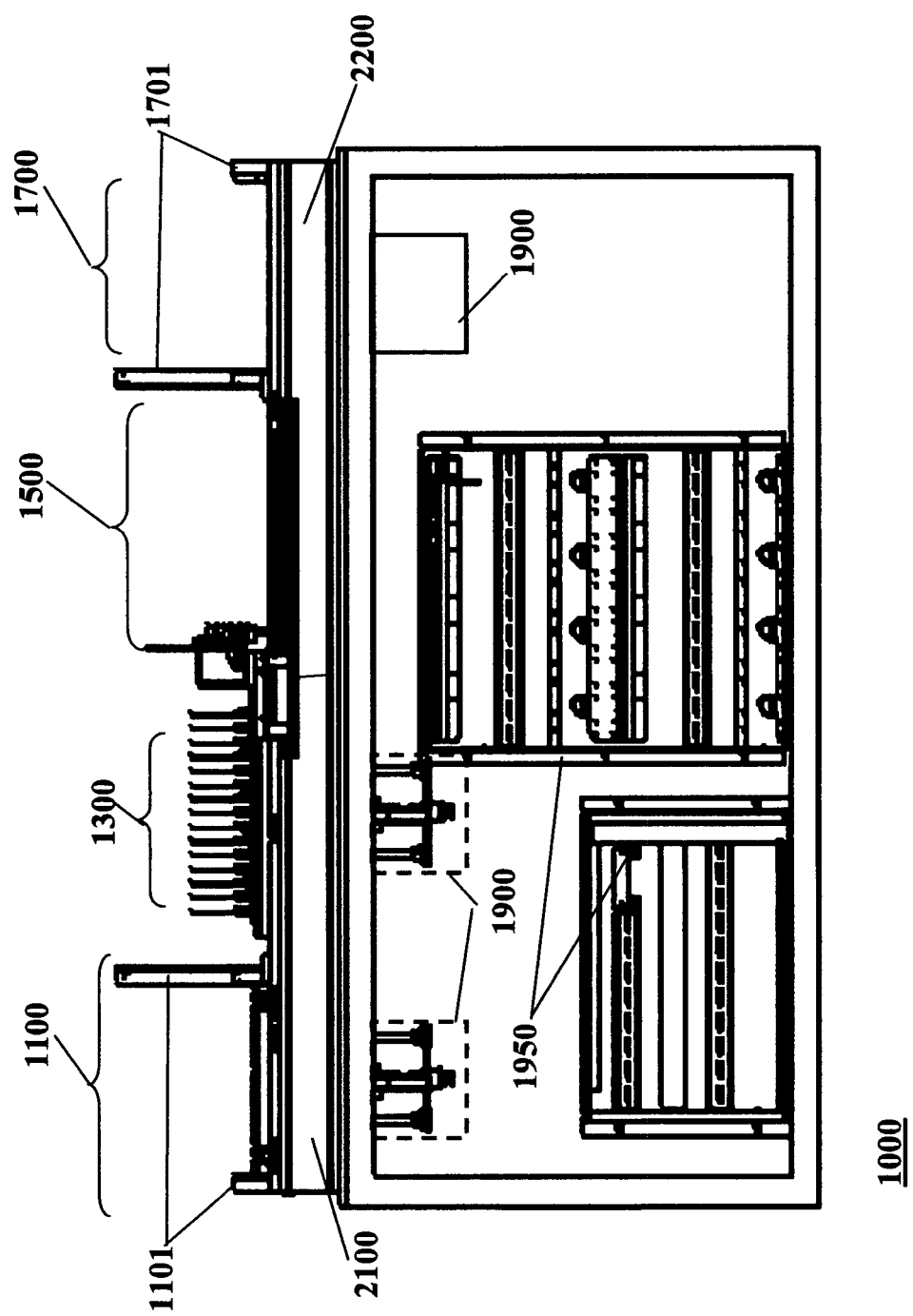
FIG. 6 is a front view of the system of FIG. 4.
Figure 7:
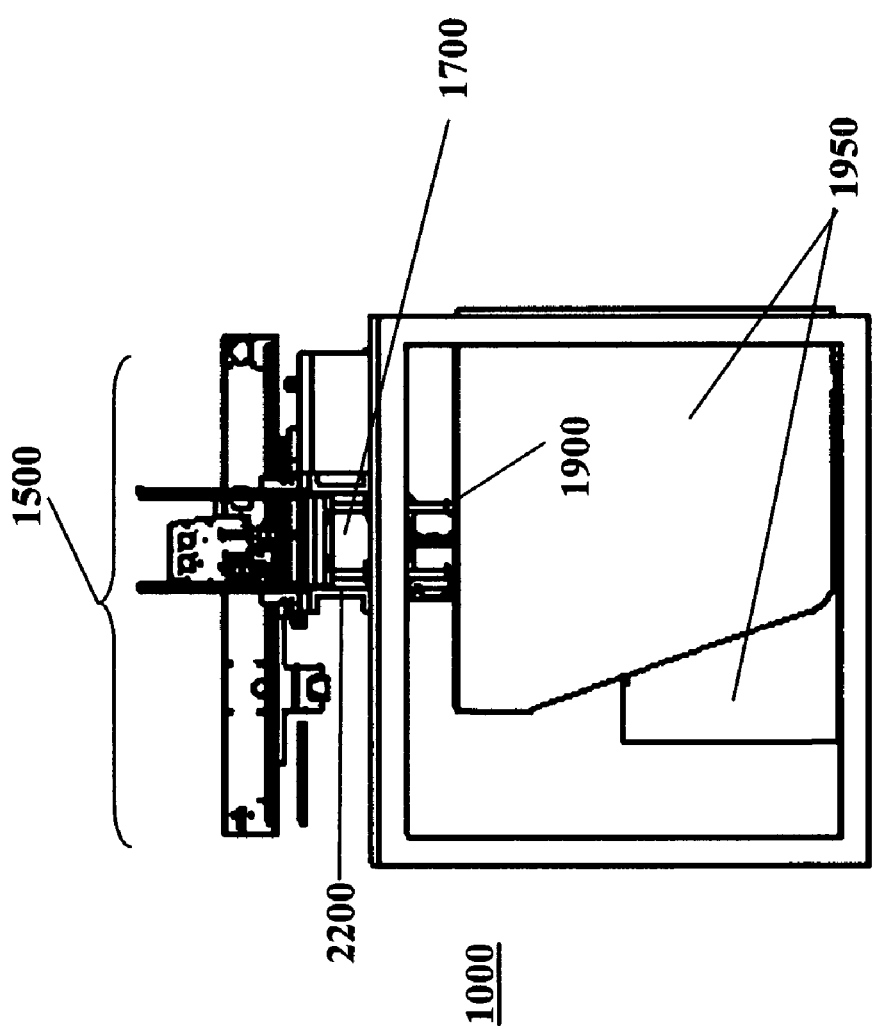
FIG. 7 is an end view of the system of FIG. 4.

As testing is performed, a map of each tray is made showing the test results for each device. The test results may include characterization of the type of test failure for failed devices. Second tray handler 1900 lowers JEDEC tray 101 from the test position onto rails 2105, 2107. Belts 2109, 2111 are operated such that tabs 2115, 2117 engage the rear edge of JEDEC tray 101 and move the tested JEDEC tray from its position under hive 1300 unto second transport arrangement 2200 to a sorting module 1500 as best seen in FIGS. 6 and 7. The tested tray is placed in position 1501.

The first tested tray is moved to position 1503 and the devices that did pass electrical testing ("good devices") are utilized to replace devices that fail testing in subsequent trays. Once all devices from the tray at position 1503 are removed, a new tested tray is moved to position 1503. The movement of the first tested tray to position 1503 may be accomplished by any of a number of known apparatus and methods. Sorting module 1500, controlled by electronics modules 1950 utilizing the map identifying devices that failed testing, utilizes a pick-up arm 1507 to lift devices that did not pass electrical testing (a "failed device") from the JEDEC tray at position 1503 to an initially empty tray for failed devices at position 1505. Once all failed devices are removed from the JEDEC tray at position 1503, only good devices or devices that did pass electrical testing remain in the tray at position 1503.

The next JEDEC tray that completes testing is transported to the sorting module 1500 at position 1501. Pick up arm 1507 is utilized to remove each failed device from the JEDEC tray at position 1501 to the JEDEC tray at position 1505. The vacant positions in the tray at position 1501 are each populated with devices from the JEDEC tray at position 1503. The devices in the JEDEC tray at position 1503 are utilized to replace the failed devices removed from the JEDEC tray at position 1501 by again utilizing pick-up arm 1507. The removal of failed devices and repopulating with good devices continues until the tray at position 1501 is fully populated with all good devices. Once the JEDEC tray at position 1501 is fully populated with good devices, second transport arrangement 2200 moves the JEDEC tray to the un-loader module 1700. In this manner, a JEDEC tray is provided that contains 100% tested good devices. The failed devices are separated and placed into a JEDEC tray at position 1505.

Second transport arrangement 2200 is constructed similar to the first transport arrangement in that it includes a pair of rails 2201, 2203 which each carry a respective flange 2205, 2207. A belt 2209 is disposed below the upper surface of flanges 2205, 2207 and has tabs 2217 extending therefrom that are used to engage the rear edge of a JEDEC tray. In the embodiment shown, only one belt 2209 is utilized in the second transport arrangement 2200.

Second transport arrangement 2200 moves each JEDEC tray 100% populated with devices that pass testing to un-loader module 1700. Although the specific structural details of the un-loader module 1700 are not shown, the structure is substantially the same as the loader module 1100. Un-loader module 1700 includes vertical supports 1701 that position trays into a stack of JEDEC trays. Disposed below un-loader module 1700 is a third tray handler 1900. Third tray handler 1900 operates in the same manner as the first and second tray handler. Third tray handler 1900 includes a lift plate 1901 that is raised and lowered by a motor 1909. Lift plate 1900 is sized such that it fits between flanges 2205, 2207.

When a JEDEC tray is moved into position in un-loader module 1700, third tray handler 1900 raises the tray. The JEDEC trays are each raised to a position that lifts any trays above until the bottom of the stack of trays is proximate solenoid actuated blade supports, each disposed on a corresponding one vertical support 1701. As the tray is lifted into engagement with the bottom of the stack, the blade supports retract allowing the bottom of the tray to be raised above the plane of the blade supports. The blade supports then extend to support the bottom of the bottom tray of the stack and the third tray handler 1900 lowers the plate 1901 to its rest position.

Although only one JEDEC tray position is shown at position 1505, other embodiments of the invention can include multiple tray positions 1505 for failed devices so that the failed devices may be sorted in accordance with a predetermined criteria.

In other embodiments of the invention additional test hives 1300 may be provided and each test hive may test a portion of the devices 105 in a JEDEC tray, or alternatively may be used to test an electrical portion of each device in a JEDEC tray. These alternate arrangements may be utilized to increase testing throughput.

In addition, a map of the test results for each device that passed the tests may be maintained. All mapping as well as control of system 1000 are provided by electronics modules 1950 which include a microprocessor module, memory module, test interfaces and associated electronics.

The invention has been described in terms of a specific embodiment. It is not intended that the invention or the claims appended hereto be limited to the illustrative embodiment shown and described. It will be apparent to those skilled in the art that various changes and modifications may be made to the embodiments without departing from the spirit or scope of the invention. Accordingly, the invention should be limited only by the scope of the claims appended hereto.

What is claimed is:

1. A method for testing System in Package (SIP) devices each having a plurality of electrical contacts, comprising:
   receiving said SIP devices in industry standard device processing trays having a plurality of SIP device receiving cells;
   forming a stack of said trays of SIP devices;
   orienting said stack of said trays such that said contacts on each of said devices are in a predetermined orientation;
   providing a test hive comprising a plurality of test circuits corresponding in number to at least a predetermined portion of said cells; and providing a plurality of groups of test contacts, each of said group of test contacts being coupled to a corresponding one of said test circuits and being oriented to engage said plurality of electrical contacts of a SIP device disposed in a corresponding one of said cells;
   moving each said tray from said stack one at a time to a position proximate said test hive;
   causing relative movement of said tray proximate said test hive whereby said test hive engages said tray of SIP devices such that electrical connection is made simultaneously by each of said groups of test contacts with said electrical contacts of a SIP device disposed in said corresponding one of said cells; and
   simultaneously, electrically testing at least a predetermined portion of all of said SIP devices in each tray engaged by said hive without removing said SIP devices from said tray.

2. A method in accordance with claim 1, comprising:
   identifying each said SIP device in tested tray of SIP devices according to electrical testing results.

3. A method in accordance with claim 2, comprising:
   causing relative movement of said tray proximate said test hive whereby said test hive disengages said tray of electrically tested said SIP devices.

4. A method in accordance with claim 3, comprising:
   transporting each said disengaged tray of electrically tested SIP devices to a sorter module.

5. A method in accordance with claim 4, comprising:
   providing at said sorter module at least one tray for receiving electrically tested SIP devices that do not pass electrical testing;
   removing each said SIP device that did not pass electrical testing from a first transported tray of SIP devices in said sorter, and
   placing each said device that did not pass electrical testing in said at least one tray.

6. A method in accordance with claim 5, comprising:
   receiving in said sorter module a second tray of electrically tested SIP devices;

removing each said SIP device from said second tray that does not pass electrical testing; and placing each said SIP device that did not pass electrical testing removed from said second tray into said as least one tray for receiving electrically tested SIP devices that do not pass electrical testing.

7. A method in accordance with claim 6, comprising:

replacing each said SIP device removed from said second tray with a SIP device that did pass electrical testing from said first transported tray.

8. A method in accordance with claim 7, comprising:

transporting said second tray from said sorter module to an unloader module when said second tray is fully populated with SIP devices that pass electrical testing.

9. A method in accordance with claim 8, comprising:

automatically stacking each said tray received by said unloader module.

10. A method in accordance with claim 2, comprising:

providing said identifying step by mapping the results of the testing of all of said SIP devices in each said tested tray.

11. A method in accordance with claim 1, comprising:

providing said test hive with a first member configured to receive each said tray engaged by said hive; and including a plurality of alignment surfaces on said first member to provide alignment of each said tray engaged by said hive to adjust for dimensional tolerance differences of each said tray.

12. A method in accordance with claim 11 comprising:

providing said hive with a contactor assembly, said contactor assembly comprising a second plurality of alignment surfaces each associated with a corresponding one of said cells to provide alignment of each SIP device in each said corresponding one of said cells to adjust for dimensional tolerance differences of each said SIP device.

13. A method in accordance with claim 12, comprising:

providing said contactor assembly with an insulating plate member carrying said test contacts.

14. A method in accordance with claim 13, comprising:

providing said contactor assembly with a metallic plate member carrying said second plurality of alignment surfaces.

15. A method for testing System in Package (SIP) devices each having a plurality of electrical contacts, comprising:

receiving said SIP devices in a JEDEC standard device processing trays having a plurality of SIP device receiving cells;

orienting each said tray such that said contacts on each of said devices are in a predetermined orientation to engage test contacts;

providing a test hive comprising a plurality of test circuits corresponding in number to at least a predetermined portion of said cells; and providing a plurality of groups of said test contacts, each of said group of said test contacts being coupled to a corresponding one of said test circuits and being oriented to engage said plurality of electrical contacts of a SIP device disposed in a corresponding one of said cells;

moving each said tray to a position proximate said test hive;

causing relative movement of said tray proximate said test hive whereby said test hive engages said tray of SIP devices such that electrical connection is made simultaneously by each of said groups of test contacts with said electrical contacts of a SIP device disposed in said corresponding one of said cells; and simultaneously, electrically testing at least a predetermined portion of said SIP devices in each tray engaged by said hive without removing said SIP devices from said tray.

16. A method in accordance with claim 15, comprising:

causing relative movement of said tray proximate said test hive whereby said test hive disengages said tray of electrically tested said SIP devices.

17. A method in accordance with claim 16, comprising:

transporting each said disengaged tray of electrically tested SIP devices to a sorter module.

18. A method in accordance with claim 17, comprising:

removing each electrically tested SIP device that did not pass electrical testing from each said transported tray.

19. A method in accordance with claim 18, comprising:

replacing each removed electrically tested SIP devices that did not pass electrical testing from each said transported tray with an SIP device that did pass said electrical testing.

20. A method with claim 19, comprising:

repeating said removing and replacing steps for each transported tray until said transported tray is fully populated with SIP device that pass electrical testing.

* * * * *